United States Patent
Seferos et al.

(10) Patent No.: US 9,035,016 B2
(45) Date of Patent: *May 19, 2015

(54) CONJUGATED POLYMER COMPOSITION FOR SOLAR CELL AND FLEXIBLE ELECTRONICS APPLICATIONS

(71) Applicant: Saudi Basic Industries Corporation, Riyadh (SA)

(72) Inventors: Dwight Seferos, Mississauga (CA); Brandon Djukic, Toronto (CA); Ahmed I. Abdelrahman, Thuwal (SA)

(73) Assignee: Saudi Basic Industries Corporation, Riyadh (SA)

( * ) Notice: Subject to any disclaimer, the term of this patent is extended or adjusted under 35 U.S.C. 154(b) by 0 days.

This patent is subject to a terminal disclaimer.

(21) Appl. No.: 14/022,867

(22) Filed: Sep. 10, 2013

(65) Prior Publication Data
US 2014/0073755 A1 Mar. 13, 2014

Related U.S. Application Data

(60) Provisional application No. 61/699,093, filed on Sep. 10, 2012.

(51) Int. Cl.
C08G 75/00 (2006.01)
H01L 51/00 (2006.01)
C08G 61/12 (2006.01)
(Continued)

(52) U.S. Cl.
CPC ........ H01L 51/0039 (2013.01); H01L 51/0036 (2013.01); H01L 51/0043 (2013.01); H01L 51/0047 (2013.01); H01L 51/4253 (2013.01); C08G 61/123 (2013.01); C08G 61/126 (2013.01); C08G 2261/124 (2013.01); C08G 2261/3142 (2013.01); C08G 2261/3223 (2013.01); C08G 2261/3246 (2013.01); C08G 2261/91 (2013.01); C08G 73/0677 (2013.01); Y02E 10/549 (2013.01); B82Y 10/00 (2013.01)

(58) Field of Classification Search
USPC ...................... 528/380; 428/690; 252/301.16; 548/418; 549/331, 349, 41, 456, 46, 549/460; 564/426; 568/14, 8
See application file for complete search history.

(56) References Cited

U.S. PATENT DOCUMENTS

2006/0046092 A1 3/2006 Towns et al.
2008/0262183 A1 10/2008 Lehmann
(Continued)

FOREIGN PATENT DOCUMENTS

JP 2011071163 A 4/2011
WO 2011017341 A2 2/2011
WO 2011025454 A1 3/2011

OTHER PUBLICATIONS

Xia, Yangjun, et al., "Synthesis and Photovoltaic Properties of Alternating Conjugated Polymers Derived from Indeno [1,2-b]fluorene and Bithiophene or Thieno[3,2-b]thiophene-Cored enzothiadiazole", Macromol. Chem. Phys., 2011, 212, 1193-1201.
(Continued)

*Primary Examiner* — Shane Fang
(74) *Attorney, Agent, or Firm* — Cantor Colburn LLP

(57) ABSTRACT

A polymer composition for solar cell and flexible electronics devices, where the polymer is a p-type conducting polymer. The p-type polymer comprises a benzothiadiazole acceptor and indeno-fluorene donor. Further, a solar cell and flexible electronic device article may be made from the polymer.

24 Claims, 5 Drawing Sheets

(51) Int. Cl.
*C08G 73/06* (2006.01)
*B82Y 10/00* (2011.01)
*H01L 51/42* (2006.01)

(56) References Cited

U.S. PATENT DOCUMENTS

2011/0187266 A1* 8/2011 Fukushima et al. .......... 313/504
2012/0232238 A1* 9/2012 Katz et al. .......................... 528/8
2014/0073753 A1 3/2014 Seferos et al.

OTHER PUBLICATIONS

Zheng, Qingdong, et al., "Ladder-Type Oligo-p-phenylene-Containing Copolymers with High Open-Circuit Voltages and Ambient Photovoltaic Activity", J. Am. Chem. Soc., 2010, 132, 5394-5404.

Clarke et al.; "Analysis of Charge Photogeneration as a Key Determinant of Photocurrent Density in Polymer: Fullerene Solar Cells"; Advanced Materials, 2010; 22; pp. 5287-5291.

Fan et al.; "Dinaphtho-s-indacene-based copolymers for inverted organic solar cells with high open-circuit voltages"; Polymer SS; 2014; pp. 2262-2270.

Jamieson et al.; "Fullerene crystallisation as a key driver of charge separation in polymer/fullerene bulk heterojunction solar cells"; Chemical Science 2012; 3; pp. 485-492.

Kirkpatrick et al.; "A Systematic Approach to the Design Optimization of Light-Absorbing Indenofluorene Polymers for Organic Photovoltaics"; Advanced Energy Materials, 2012; 2; pp. 260-265.

International Search Report for International Application No. PCT/US2013/059012; International Filing Date: Sep. 10, 2013; Date of Mailing: Jun. 4, 2014; 6 pages.

Written Opinion of the International Search Report for International Application No. PCT/US2013/059012; International Filing Date: Sep. 10, 2013; Date of Mailing: Jun. 4, 2014; 6 pages.

International Search Report for International Application No. PCT/US2013/059019; International Filing Date: Sep. 10, 2013; Date of Mailing: Jun. 4, 2014; 7 pages.

Written Opiniion of the International Search Report for International Application No. PCT/US2013/059019; International Filing Date: Sep. 10, 2013; Date of Mailing: Jun. 4, 2014; 7 pages.

Soon et al.; "Material Crystallinity as a Determinant of Triplet Dynamics and Oxygen Quenching in Donor Polymers for Organic Photovoltaic Devices"; Advanced Functional Materials, 2014; 24; pp. 1474-1482.

Tamilavan et al.; "Synthesis of new near infrared absorption polymers based on thiadiazoloquinoxaline and their solar cell application"; Synthetic Metals 2012; 162; pp. 1184-1189.

Tremblay et al.; "Digital-Inverter Amine Sensing via Synergistic Responses by n and p Organic Semiconductors"; Adv. Funct. Mater, 2011; 21; pp. 4314-4319.

Yin et al.; "Interface Control of Semiconducting Metal Oxide Layers for Efficient and Stable Inverted Polymer Solar Cells with Open-Circuit Voltages over 1.0 Volt"; Applied Materials & Interfaces; 2013; pp. 9015-9025.

* cited by examiner

CONJUGATED POLYMER COMPOSITION FOR SOLAR CELL AND FLEXIBLE ELECTRONICS APPLICATIONS

CROSS-REFERENCE TO RELATED APPLICATION

This application claims the benefit of U.S. Provisional Patent Application Ser. No. 61/699,093, filed on Sep. 10, 2012. The related application is incorporated herein by reference in its entirety.

BACKGROUND OF THE INVENTION

For a solar cell to function, three processes are performed: (1) absorption of light; (2) movement of electrons; and (3) movement of holes in a direction opposite to the movement of electrons. Polymer materials may be used because they have optoelectronic properties that may be controlled at the molecular level. Materials may be tailored to provide large extinction coefficients with band-gap spacing and energy level alignment to yield high output characteristics, such as open circuit potential ($V_{oc}$) and power conversion efficiency (PCE).

Accordingly, there remains a need for conjugated polymer compositions to be used as semiconductors in low-cost solar cell and flexible electronics that are easily synthesized and purified on large scales. This and other needs are satisfied by the various aspects of the present disclosure.

SUMMARY OF THE INVENTION

This invention relates generally to p-type conducting polymers. The p-type polymer comprises a benzothiadiazole acceptor and indeno-fluorene donor.

In an embodiment, a polymer comprises "n" repeating units of poly formula [I]:

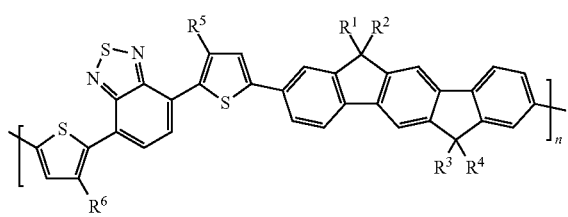

[I]

wherein "n" is an integer greater than 1;
wherein each of $R^1$ and $R^2$ is independently selected from C1-C18 alkyl, C1-C1-C18 alkoxy, $Cy^1$, $Cy^1$-(C1-C18 alkyl)-, $Ar^1$, and $Ar^1$—(C1-C18 alkyl)-;
wherein $R^1$ and $R^2$ are optionally covalently bonded to form a 3- to 17-membered cycloalkyl or, together with 1-3 heteroatoms, comprise a 4- to 17-membered heterocycloalkyl;
wherein each of $R^3$ and $R^4$ is independently selected from C1-C18 alkyl, C1-C18 alkoxy, $Cy^1$, $Cy^1$-(C1-C18 alkyl)-, $Ar^1$, and $Ar^1$—(C1-C18 alkyl)-;
wherein $R^3$ and $R^4$ are optionally covalently bonded to form a 3- to 17-membered cycloalkyl or, together with 1-3 heteroatoms, comprise a 4- to 17-membered heterocycloalkyl;
wherein each of $R^5$ and $R^6$ is independently selected from C1-C18 alkyl, C1-C18 alkoxy, C1-C18 monoalkylamino, C1-C18 dialkylamino, $Cy^1$, $Cy^1$-(C1-C18 alkyl)-, $Ar^1$, $Ar^1$—(C1-C18 alkyl)-, —(C1-C18 alkyl)-, —(C1-C18 alkyl)-(C=O)$R^7$, —(C1-C18 alkyl)-(C=O)O$R^7$, —(C1-C18 alkyl)-S(O)$_m$$R^7$, —(C=O)$R^7$, —(C=O)O$R^7$, and —S(O)$_m$$R^7$;
wherein $Ar^1$ is selected from phenyl and heteroaryl, and independently substituted with 0, 1, 2, 3, or 4 groups independently selected from C1-C18 alkyl, C1-C18 alkoxy, C1-C18 alkylamino, and C1-C18 dialkylamino;
wherein $Cy^1$ is selected from C3-C18 cycloalkyl and C2-C17 heterocycloalkyl, and substituted with 0, 1, 2, 3, or 4 groups independently selected from C1-C18 alkyl, C1-C18 alkoxy, C1-C18 alkylamino, and C1-C18 dialkylamino; and
wherein $R^7$ is selected from hydrogen, C1-C18 alkyl, C1-C18 alkoxy, C1-C18 monoalkylamino, and C1-C18 dialkylamino.

A method for preparing a polymer comprises providing a monomer of general formula [1]:

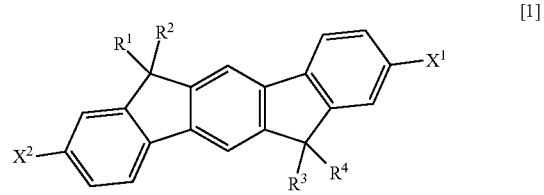

[1]

wherein each of $R^1$ and $R^2$ is independently selected from C1-C18 alkyl, C1-C18 alkoxy, $Cy^1$, $Cy^1$-(C1-C18 alkyl)-, $Ar^1$, and $Ar^1$—(C1-C18 alkyl)-;
wherein $R^1$ and $R^2$ are optionally covalently bonded to form a 3- to 17-membered cycloalkyl or, together with 1-3 heteroatoms, comprise a 4- to 17-membered heterocycloalkyl;
wherein each of $R^3$ and $R^4$ is independently selected from C1-C18 alkyl, C1-C18 alkoxy, $Cy^1$, $Cy^1$-(C1-C18 alkyl)-, $Ar^1$, and $Ar^1$—(C1-C18 alkyl)-;
wherein $R^3$ and $R^4$ are optionally covalently bonded to form a 3- to 17-membered cycloalkyl or, together with 1-3 heteroatoms, comprise a 4- to 17-membered heterocycloalkyl;
wherein $Ar^1$ is selected from phenyl and heteroaryl, and independently substituted with 0, 1, 2, 3, or 4 groups independently selected from C1-C18 alkyl, C1-C18 alkoxy, C1-C18 alkylamino, and C1-C18 dialkylamino;
wherein $Cy^1$ is selected from C3-C18 cycloalkyl and C2-C17 heterocycloalkyl, and substituted with 0, 1, 2, 3, or 4 groups independently selected from C1-C18 alkyl, C1-C18 alkoxy, C1-C18 alkylamino, and C1-C18 dialkylamino; and
wherein each of $X^1$ and $X^2$ is independently selected from halogen, triflates, nonaflates, fluorosulfonates, tosylates, mesylates, nitrates, phosphates, oxonium ions, diazonium salts, ammonium salts, alcohols, and ethers;
providing a monomer of general formula [2]:

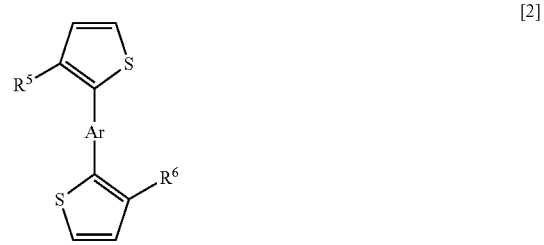

[2]

wherein Ar is selected from phenyl, heteroaryl, fused aryl, fused heteroaryl, and an aryl fused with a heteroaryl; and independently substituted with 0, 1, 2, 3, or 4 groups independently selected from C1-C18 alkyl, C1-C18 alkoxy, C1-C18 alkylamino, and C1-C18 dialkylamino; and wherein each of $R^5$ and $R^6$ is independently selected from C1-C18 alkyl, C1-C18 alkoxy, C1-C18 monoalkylamino, C1-C18 dialkylamino, $Cy^1$, $Cy^1$-(C1-C18 alkyl)-, $Ar^1$, $Ar^1$—(C1-C18 alkyl)-, —(C1-C18 alkyl)-(C=O)$R^7$, —(C1-C18 alkyl)-(C=O)O$R^7$, —(C1-C18 alkyl)-S(O)$_m$$R^7$, —(C=O) $R^7$, —(C=O)O$R^7$, and —S(O)$_m$$R^7$; and wherein $R^7$ is selected from C1-C18 alkyl, C1-C18 alkoxy, C1-C18 monoalkylamino, C1-C18 dialkylamino; and reacting the monomer of formula [1] and monomer of formula [2] in the presence of a transition metal catalyst under conditions effective to form a polymer comprising "n" repeating units of poly formula [III]:

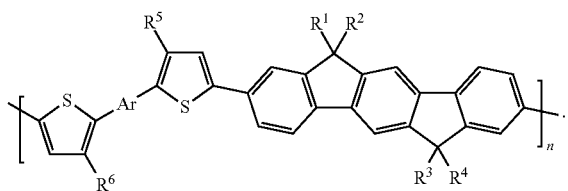

[III]

In further embodiments, disclosed are articles generally comprising a p-type polymer comprising a benzothiadiazole acceptor and indeno-fluorene donor. For example, disclosed are articles comprising a polymer of poly formula [I]. In at least one embodiment, the article is a solar cell and/or flexible electronics.

Other details and advantages will be set forth in part in the description that follows or may be learned by practice. The advantages will be realized and attained by means of the elements and combinations particularly pointed out in the appended claims. It is to be understood that both the foregoing general description and the following detailed description are exemplary and explanatory only and are not restrictive, as claimed.

BRIEF DESCRIPTION OF THE DRAWINGS

The accompanying drawings, which are incorporated in and constitute a part of this specification, illustrate exemplary embodiments and together with the description, serve to explain the principles of the compositions, methods and systems disclosed herein.

FIG. 3 shows data for the effect of donor to acceptor ratio on device performance; in particular.

FIG. 4 shows data for the effect of 1-CN concentration on device performance; in particular.

FIG. 5 shows data for the effect of annealing temperature on device performance; in particular.

DETAILED DESCRIPTION OF THE INVENTION

Figure 1:
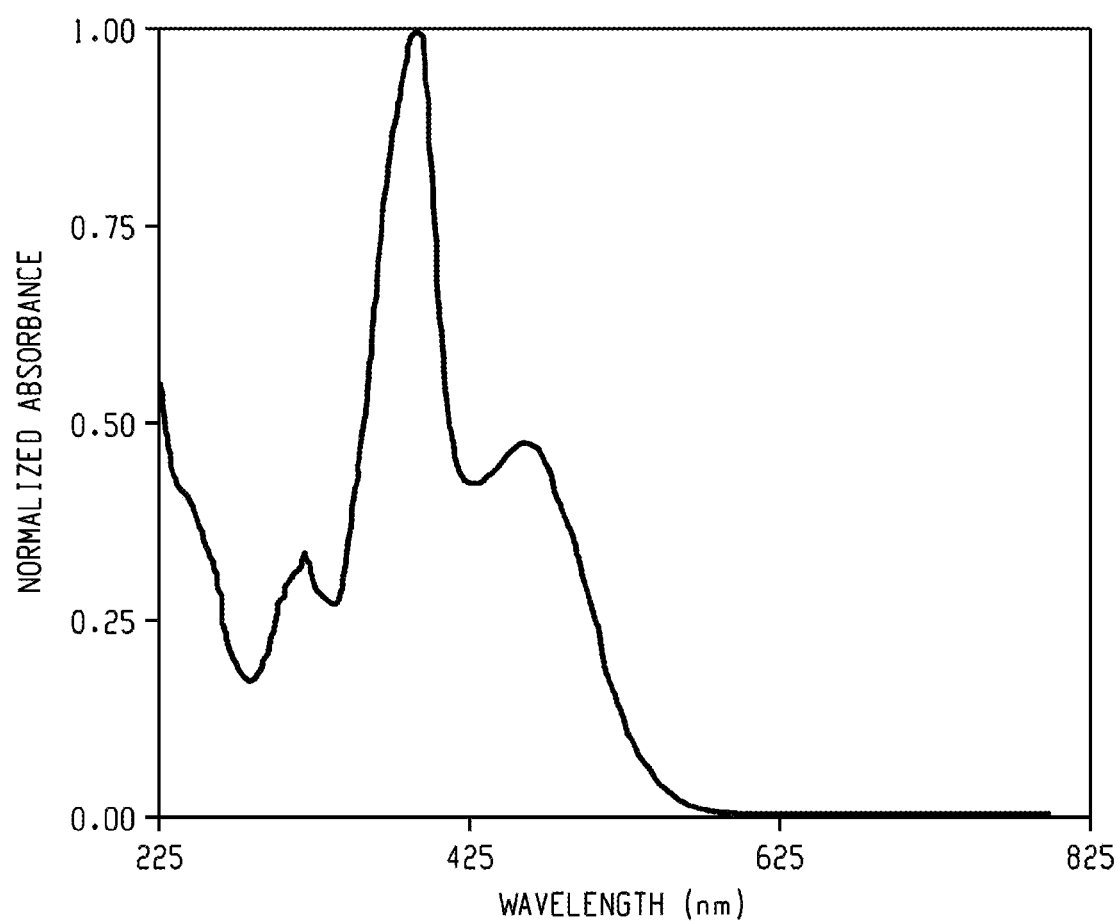
FIG. 1 is an absorbance profile of a polymer of poly formula [II].

The present invention can be understood more readily by reference to the following detailed description, examples, drawings, and claims, and their previous and following description. However, before the present compositions, articles, devices, systems, and/or methods are disclosed and described, it is to be understood that this invention is not limited to the specific compositions, articles, devices, systems, and/or methods disclosed unless otherwise specified, as such can vary. It is also to be understood that the terminology used herein is for the purpose of describing particular aspects only and is not intended to be limiting.

The following description of the invention is also provided as an enabling teaching of the invention in its best, currently known embodiment. To this end, those of ordinary skill in the relevant art will recognize and appreciate that changes and modifications can be made to the various aspects of the invention described herein, while still obtaining the beneficial results of the present invention. It will also be apparent that some of the desired benefits of the present invention can be obtained by selecting some of the features of the present invention without utilizing other features. Accordingly, those of ordinary skill in the relevant art will recognize that many modifications and adaptations to the present invention are possible and can even be desirable in certain circumstances and are thus also a part of the present invention. Thus, the following description is provided as illustrative of the principles of the present invention and not in limitation thereof.

Various combinations of elements of this disclosure are encompassed by this invention, e.g. combinations of elements from dependent claims that depend upon the same independent claim.

Moreover, it is to be understood that unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; and the number or type of embodiments described in the specification.

All publications mentioned herein are incorporated herein by reference to disclose and describe the methods and/or materials in connection with which the publications are cited.

It is also to be understood that the terminology used herein is for the purpose of describing particular aspects only and is not intended to be limiting. As used in the specification and in the claims, the term "comprising" may include the embodiments "consisting of" and "consisting essentially of" Unless defined otherwise, all technical and scientific terms used herein have the same meaning as commonly understood by one of ordinary skill in the art to which this invention belongs. In this specification and in the claims that follow, reference will be made to a number of terms which shall be defined herein.

As used in the specification and the appended claims, the singular forms "a," "an," and "the" include plural referents unless the context clearly dictates otherwise. Thus, for example, reference to "a polycarbonate" includes mixtures of two or more such polycarbonates. Furthermore, for example, reference to a filler includes mixtures of fillers.

Ranges can be expressed herein as from "about" one particular value, and/or to "about" another particular value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed. It is also understood that each unit between two particular units are also disclosed. For example, if 10 and 15 are disclosed, then 11, 12, 13, and 14 are also disclosed.

As used herein, the terms "optional" or "optionally" mean that the subsequently described event, condition, component, or circumstance may or may not occur, and that the description includes instances where said event or circumstance occurs and instances where it does not.

As used herein, the term or phrase "effective," "effective amount," or "conditions effective to" refers to such amount or condition that is capable of performing the function or property for which an effective amount is expressed. As will be pointed out below, the exact amount or particular condition required will vary from one embodiment to another, depending on recognized variables such as the materials employed and the processing conditions observed. Thus, it is not always possible to specify an exact "effective amount" or "condition effective to." However, it should be understood that an appropriate effective amount will be readily determined by one of ordinary skill in the art using only routine experimentation.

Disclosed are the components to be used to prepare disclosed compositions of the invention as well as the compositions themselves to be used within methods disclosed herein. These and other materials are disclosed herein, and it is understood that when combinations, subsets, interactions, groups, etc. of these materials are disclosed that while specific reference of each various individual and collective combinations and permutation of these compounds can not be explicitly disclosed, each is specifically contemplated and described herein. For example, if a particular compound is disclosed and discussed and a number of modifications that can be made to a number of molecules including the compounds are discussed, specifically contemplated is each and every combination and permutation of the compound and the modifications that are possible unless specifically indicated to the contrary. Thus, if a class of molecules A, B, and C are disclosed as well as a class of molecules D, E, and F and an example of a combination molecule, A-D is disclosed, then even if each is not individually recited each is individually and collectively contemplated meaning combinations, A-E, A-F, B-D, B-E, B-F, C-D, C-E, and C—F are considered disclosed. Likewise, any subset or combination of these is also disclosed. Thus, for example, the sub-group of A-E, B-F, and C-E would be considered disclosed. This concept applies to all aspects of this application including, but not limited to, steps in methods of making and using the compositions of the invention. Thus, if there are a variety of additional steps that can be performed it is understood that each of these additional steps can be performed with any specific aspect or combination of aspects of the methods of the invention.

References in the specification and concluding claims to parts by weight, of a particular element or component in a composition or article, denote the weight relationship between the element or component and any other elements or components in the composition or article for which a part by weight is expressed. Thus, in a composition containing 2 parts by weight of component X and 5 parts by weight component Y, X and Y are present at a weight ratio of 2:5, and are present in such ratio regardless of whether additional components are contained in the compound.

A weight percent of a component, unless specifically stated to the contrary, is based on the total weight of the formulation or composition in which the component is included. For example if a particular element or component in a composition or article is said to have 8% weight, it is understood that this percentage is relation to a total compositional percentage of 100%.

Compounds are described using standard nomenclature. For example, any position not substituted by any indicated group is understood to have its valency filled by a bond as indicated, or a hydrogen atom. A dash ("-") that is not between two letters or symbols is used to indicate a point of attachment for a substituent. For example, —CHO is attached through carbon of the carbonyl group. Unless defined otherwise, technical and scientific terms used herein have the same meaning as is commonly understood by one of skill in the art to which this invention belongs.

As described above, the present disclosure describes a polymer composition, a polymer article, and a method of making the composition and article. In at least one embodiment, the polymer composition may be used as semiconductors in low-cost solar cells or flexible electronics that are easily synthesized and purified on large scales.

The polymer comprises "n" repeating units of poly formula [I]:

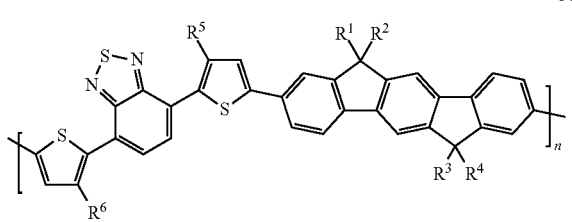

[I]

wherein "n" is an integer greater than 1;

wherein each of $R^1$ and $R^2$ is independently selected from C1-C18 alkyl, C1-C18 alkoxy, $Cy^1$, $Cy^1$-(C1-C18 alkyl)-, $Ar^1$, and $Ar^1$—(C1-C18 alkyl)-;

wherein $R^1$ and $R^2$ are optionally covalently bonded to form a 3- to 17-membered cycloalkyl or, together with 1-3 heteroatoms, comprise a 4- to 17-membered heterocycloalkyl;

wherein each of $R^3$ and $R^4$ is independently selected from C1-C18 alkyl, C1-C18 alkoxy, $Cy^1$, $Cy^1$-(C1-C18 alkyl)-, $Ar^1$, and $Ar^1$—(C1-C18 alkyl)-;

wherein $R^3$ and $R^4$ are optionally covalently bonded to form a 3- to 17-membered cycloalkyl or, together with 1-3 heteroatoms, comprise a 4- to 17-membered heterocycloalkyl;

wherein each of $R^5$ and $R^6$ is independently selected from C1-C18 alkyl, C1-C18 alkoxy, C1-C18 monoalkylamino, C1-C18 dialkylamino, $Cy^1$, $Cy^1$-(C1-C18 alkyl)-, $Ar^1$, $Ar^1$—(C1-C18 alkyl)-, —(C1-C18 alkyl)-(C=O)$R^7$, —(C1-C18 alkyl)-(C=O)O$R^7$, —(C1-C18 alkyl)-S(O)$_m R^7$, —(C=O)$R^7$, —(C=O)O$R^7$, and —S(O)$_m R^7$;

wherein $Ar^1$ is selected from phenyl and heteroaryl, and independently substituted with 0, 1, 2, 3, or 4 groups independently selected from C1-C18 alkyl, C1-C18 alkoxy, C1-C18 alkylamino, and C1-C18 dialkylamino;

wherein $Cy^1$ is selected from C3-C18 cycloalkyl and C2-C17 heterocycloalkyl, and substituted with 0, 1, 2, 3, or 4 groups independently selected from C1-C18 alkyl, C1-C18 alkoxy, C1-C18 alkylamino, and C1-C18 dialkylamino; and wherein $R^7$ is selected from hydrogen, C1-C18 alkyl, C1-C18 alkoxy, C1-C18 monoalkylamino, and C1-C18 dialkylamino.

In at least one embodiment, "n" of poly formula [I] is an integer ranging from 2 to 10,000. In at least one embodiment, "n" of poly formula [I] is an integer ranging from 5 to 500. In another embodiment, "n" of poly formula [I] is an integer ranging from 12 to 500. In a further embodiment, "n" of poly formula [I] is an integer ranging from 100 to 300.

In at least one embodiment, $R^1$, $R^2$, $R^3$, and $R^4$ are independently selected from C1-C18 alkyl and C1-C18 alkoxy. $R^1$, $R^2$, $R^3$, and $R^4$ may be selected from all possible isomers or enantiomers, including mixtures of isomers or enantiomers, of the C1-C18 alkyl and C1-C18 alkoxy. In another embodiment, $R^1$, $R^2$, $R^3$, and $R^4$ are independently selected from C1-C18 alkyl.

In at least one embodiment, $R^1$, $R^2$, $R^3$, and $R^4$ are independently selected, for example, from methyl, ethyl, propyl, isopropyl, tert-butyl, sec-butyl, isobutyl, neopentyl, isopentyl, sec-pentyl, tert-pentyl, 3,3-dimethylbutan-2-yl, and 2,3-dimethylbutan-2-yl. $-OCH_3$, $-OCH_2CH_3$, $-O(CH_2)_2CH_3$, $-OCH(CH_3)_2$, $-OCH(CH_2CH_3)(CH_3)$, $-O(CH_2)_3CH_3$, $-O(CH_2)_4-CH_3$, $-O(CH_2)_5CH_3$, $-O(CH_2)_6CH_3$, $-O(CH_2)_7CH_3$, $-O(CH_2)_8CH_3$, and $-O(CH_2)_9CH_3$.

In at least one embodiment, $R^1$, $R^2$, $R^3$, and $R^4$ are independently selected from C1-C10 alkyl and C1-C10 alkoxy, for example from C1-C8 alkyl and C1-C8 alkoxy, or C1-C8 alkyl and C1-C8 alkoxy.

In at least one embodiment, the $R^1$, $R^2$, $R^3$, and $R^4$ are independently selected from C1-C18 alkyl. In a further embodiment, $R^1$, $R^2$, $R^3$, and $R^4$ are independently selected from $C_8H_{17}$. The $C_8H_{17}$ may be chosen from all possible isomers or enantiomers, including mixtures of isomers or enantiomers. For example, possible isomers may include n-octane, 2-methylheptane, 3-methylheptane, 4-methylheptane, 3-ethylhexane, 2,2-dimethylhexane, 2,3-dimethylhexane, 2,4-dimethylhexane, 2,5-dimethylhexane, 3,3-dimethylhexane, 3,4-dimethylhexane, 3-ethyl-2-methylpentane, 3-ethyl-3-methylpentane, 2,2,3-trimethylpentane, 2,2,4-trimethylpentane, isooctane, 2,3,3-trimethylpentane, 2,3,4-trimethylpentane, and 2,2,3,3-tetramethylbutane.

In at least one embodiment, $R^1$ and $R^2$ are optionally covalently bonded and, together with the intermediate carbon comprise a 3- to 7-membered cycloalkyl. For example, the cycloalkyl may be selected from cyclopropyl, cyclopentyl, cyclohexyl, cycloheptyl, and cyclooctyl.

In at least one embodiment, $R^1$ and $R^2$ are optionally covalently bonded and, together with the intermediate carbon, and 0-2 heteroatoms comprise a 3- to 7-membered heterocycloalkyl. For example, the heterocycloalkyl may be selected from aziridinyl, oxiranyl, thiiranyl, azetidinyl, oxetanyl, thietanyl, pyrrolidinyl, tetrahydrofuranyl, tetrahydrothiophenyl, piperidinyl, tetrahydro-2H-pyranyl, tetrahydro-2H-thiopyranyl, azepanyl, oxepanyl, thiepanyl, azocanyl, oxocanyl, thiocanyl, imidazolidinyl, pyrazolidinyl, oxazolidinyl, piperazinyl, tetrahydropyrimidinyl, tetrahydropyridazinyl, oxazinanyl, morpholinyl, diazepanyl, thiomorpholinyl, and pyrrolo[3,4-c]pyrrolyl.

In at least one embodiment, $R^3$ and $R^4$ are optionally covalently bonded and, together with the intermediate carbon comprise a 3- to 7-membered cycloalkyl. For example, the cycloalkyl may be selected from cyclopropyl, cyclopentyl, cyclohexyl, cycloheptyl, and cyclooctyl.

In at least one embodiment, $R^3$ and $R^4$ are optionally covalently bonded and, together with the intermediate carbon, and 0-2 heteroatoms comprise a 3- to 7-membered heterocycloalkyl. For example, the heterocycloalkyl may be selected from aziridinyl, oxiranyl, thiiranyl, azetidinyl, oxetanyl, thietanyl, pyrrolidinyl, tetrahydrofuranyl, tetrahydrothiophenyl, piperidinyl, tetrahydro-2H-pyranyl, tetrahydro-2H-thiopyranyl, azepanyl, oxepanyl, thiepanyl, azocanyl, oxocanyl, thiocanyl, imidazolidinyl, pyrazolidinyl, oxazolidinyl, piperazinyl, tetrahydropyrimidinyl, tetrahydropyridazinyl, oxazinanyl, morpholinyl, diazepanyl, thiomorpholinyl, and pyrrolo[3,4-c]pyrrolyl.

In at least one embodiment, $R^5$ and $R^6$ are independently selected from C1-C18 alkyl, C1-C18 alkoxy, C1-C18 monoalkylamino, C1-C18 dialkylamino, $Cy^1$, $Cy^1$-(C1-C6 alkyl)-, $Ar^1$, $Ar^1$—(C1-C6 alkyl)-, —(C1-C6 alkyl)-(C=O)$R^7$, —(C1-C6 alkyl)-(C=O)O$R^7$, —(C1-C6 alkyl)-S(O)$_m$$R^7$, —(C=O)$R^7$, —(C=O)O$R^7$, and —S(O)$_m$$R^7$. $R^5$ and $R^6$ may be selected from all possible isomers or enantiomers, including mixtures of isomers or enantiomers.

In at least one embodiment, $R^5$ and $R^6$ are independently selected from C1-C18 alkyl and C1-C18 alkoxy, for example from C1-C10 alkyl and C1-C10 alkoxy, C1-C8 alkyl and C1-C8 alkoxy, or C1-C6 alkyl and C1-C6 alkoxy.

In at least one embodiment, each of $R^5$ and $R^6$ are independently selected from C1-C18 alkyl and —(C=O)$R^7$. In at least one embodiment, the $R^7$ is C1-C18 alkyl.

In at least one embodiment, $R^5$ and $R^6$ are independently selected from $C_6H_{13}$. The $C_6H_{13}$ may be chosen from all possible isomers or enantiomers, including mixtures of isomers or enantiomers. For example, possible isomers may include n-hexane, isohexane, and neohexane.

In at least one embodiment, $R^5$ and $R^6$ are independently selected, for example, from methyl, ethyl, propyl, isopropyl, tert-butyl, sec-butyl, isobutyl, neopentyl, isopentyl, sec-pentyl, tert-pentyl, 3,3-dimethylbutan-2-yl, 2,3-dimethylbutan-2-yl, $-OCH_3$, $-OCH_2CH_3$, $-O(CH_2)_2CH_3$, $-OCH(CH_3)_2$, $-OCH(CH_2CH_3)(CH_3)$, $-O(CH_2)_3CH_3$, $-O(CH_2)_4-CH_3$, $-O(CH_2)_5CH_3$, $-O(CH_2)_6CH_3$, $-O(CH_2)_7CH_3$, $-O(CH_2)_8CH_3$, $-O(CH_2)_9CH_3$, and $-NHCH_3$, $-NHCH_2CH_3$, $-NH(CH_2)_2CH_3$, $-NHCH(CH_3)_2$, $-NH(CH_2)_3CH_3$, $-NH(CH_2)_4CH_3$, $-N(CH_3)_2$, $-N(CH_3)CH_2CH_3$, $-N(CH_3)(CH_2)_2CH_3$, $-N(CH_3)CH(CH_3)_2$, $-N(CH_2CH_3)_2$, $-N(CH_2CH_3)((CH_2)_2CH_3)$, and $-N(CH_2CH_3)(CH(CH_3)_2)$. In a further embodiment, $R^5$ and $R^6$ are independently selected, for example, from $-CH_2OCH_3$, $-CH_2OCH_2CH_3$, $-CH_2O(CH_2)_2CH_3$, $-CH_2OCH(CH_3)_2$, $-CH_2OCH(CH_2CH_3)_2(CH_3)$, $-(CH_2)_2OCH_3$, $-(CH_2)_2OCH_2CH_3$, $-(CH_2)_2O(CH_2)_2CH_3$, $-(CH_2)_2OCH(CH_3)_2$, $-(CH_2)_2OCH(CH_2CH_3)_2(CH_3)$, $-CH_2CH(CH_3)OCH_3$, $-CH_2CH(CH_3)OCH_2CH_3$, $-CH_2CH(CH_3)OCH_2)_2CH_3$, $-CH_2CH(CH_3)OCH(CH_3)_2$, $-CH_2CH(CH_3)OCH(CH_2CH_3)_2(CH_3)$, $-CH_2NHCH_3$, $-CH_2NHCH_2CH_3$, $-CH_2NH(CH_2)_2CH_3$, $-CH_2NHCH(CH_3)_2$, $-CH_2NHCH(CH_2CH_3)_2(CH_3)$, $-(CH_2)_2NHCH_3$, $-(CH_2)_2NHCH_2CH_3$, $-(CH_2)_2NH(CH_2)_2CH_3$, $-(CH_2)_2NHCH(CH_3)_2$, $-(CH_2)_2NHCH(CH_2CH_3)_2(CH_3)$, $-CH_2CH(CH_3)NHCH_3$, $-CH_2CH(CH_3)NHCH_2CH_3$, $-CH_2CH(CH_3)NH(CH_2)_2CH_3$, $-CH_2CH(CH_3)NHCH(CH_3)_2$, $-CH_2CH(CH_3)NHCH(CH_2CH_3)_2(CH_3)$, $-CH_2N(CH_3)CH_3$, $-CH_2N(CH_3)CH_2CH_3$, $-CH_2N(CH_3)(CH_2)_2CH_3$, $-CH_2N(CH_3)CH(CH_3)_2$, $-CH_2N(CH_3)CH(CH_2$ CH$_3$)$_2$(CH$_3$), —(CH$_2$)$_2$N(CH$_3$)CH$_3$, —(CH$_2$)$_2$N(CH$_3$) CH$_2$CH$_3$, —(CH$_2$)$_2$N(CH$_3$)(CH$_2$)$_2$CH$_3$, —(CH$_2$)$_2$N(CH$_3$) CH(CH$_3$)$_2$, —(CH$_2$)$_2$N(CH$_3$)CH(CH$_2$CH$_3$)$_2$(CH$_3$), —CH$_2$CH(CH$_3$)N(CH$_3$)CH$_3$, —CH$_2$CH(CH$_3$)N(CH$_3$) CH$_2$CH$_3$, —CH$_2$CH(CH$_3$)N(CH$_3$)(CH$_2$)$_2$CH$_3$, —CH$_2$CH (CH$_3$)N(CH$_3$)CH(CH$_3$)$_2$, and —CH$_2$CH(CH$_3$)N(CH$_3$)CH (CH$_2$CH$_3$)$_2$(CH$_3$).

In at least one embodiment, Ar$^1$ is selected from phenyl and heteroaryl, and independently substituted with 0, 1, 2, 3, or 4 groups independently selected from C1-C18 alkyl, C1-C18 alkoxy, C1-C18 alkylamino, and C1-C18 dialkylamino. For example, Ar$^1$ may be substituted with groups independently selected from, for example from C1-C10 alkyl, C1-C10 alkoxy, C1-C10 alkylamino, and C1-C10 dialkylamino; C1-C8 alkyl, C1-C8 alkoxy, C1-C8 alkylamino, and C1-C8 dialkylamino; or C1-C6 alkyl, C1-C6 alkoxy, C1-C6 alkylamino, and C1-C6 dialkylamino. Ar$^1$ may be substituted with groups independently selected from all possible isomers or enantiomers, including mixtures of isomers or enantiomers.

In at least one embodiment, Cy$^1$ is selected from C3-C18 cycloalkyl and C2-C17 heterocycloalkyl, and substituted with 0, 1, 2, 3, or 4 groups independently selected from C1-C18 alkyl, C1-C18 alkoxy, C1-C18 alkylamino, and C1-C18 dialkylamino. For example, Cy$^1$ may be substituted with groups independently selected from, for example from C1-C10 alkyl, C1-C10 alkoxy, C1-C10 alkylamino, and C1-C10 dialkylamino; C1-C8 alkyl, C1-C8 alkoxy, C1-C8 alkylamino, and C1-C8 dialkylamino; or C1-C6 alkyl, C1-C6 alkoxy, C1-C6 alkylamino, and C1-C6 dialkylamino. Cy$^1$ may be substituted with groups independently selected from all possible isomers or enantiomers, including mixtures of isomers or enantiomers.

In another aspect, Cy$^1$ may be selected from C3-C18 cycloalkyl, for example, cyclopropyl, cyclopentyl, cyclohexyl, cycloheptyl, cyclooctyl. In a further aspect, Cy$^1$ may be selected from C2-C17 heterocycloalkyl, for example, aziridinyl, oxiranyl, thiiranyl, azetidinyl, oxetanyl, thietanyl, pyrrolidinyl, tetrahydrofuranyl, tetrahydrothiophenyl, piperidinyl, tetrahydro-2H-pyranyl, tetrahydro-2H-thiopyranyl, azepanyl, oxepanyl, thiepanyl, azocanyl, oxocanyl, thiocanyl, imidazolidinyl, pyrazolidinyl, oxazolidinyl, piperazinyl, tetrahydropyrimidinyl, tetrahydropyridazinyl, oxazinanyl, morpholinyl, diazepanyl, thiomorpholinyl, and pyrrolo[3,4-c]pyrrolyl.

In at least one embodiment, R$^7$ is selected from hydrogen, C1-C18 alkyl, C1-C18 alkoxy, C1-C18 monoalkylamino, and C1-C18 dialkylamino. For example, R$^7$ may be selected, for example from C1-C10 alkyl, C1-C10 alkoxy, C1-C10 alkylamino, and C1-C10 dialkylamino; C1-C8 alkyl, C1-C8 alkoxy, C1-C8 alkylamino, and C1-C8 dialkylamino; or C1-C6 alkyl, C1-C6 alkoxy, C1-C6 alkylamino, and C1-C6 dialkylamino. In a further embodiment, R$^7$ may be selected, for example, from methyl, ethyl, propyl, isopropyl, tert-butyl, sec-butyl, isobutyl, neopentyl, isopentyl, sec-pentyl, tert-pentyl, 3,3-dimethylbutan-2-yl, 2,3-dimethylbutan-2-yl, —OCH$_3$, —OCH$_2$CH$_3$, —O(CH$_2$)$_2$CH$_3$, —OCH(CH$_3$)$_2$, —OCH(CH$_2$CH$_3$)(CH$_3$)—O(CH$_2$)$_3$CH$_3$, —O(CH$_2$)$_4$—CH$_3$, —O(CH$_2$)$_5$CH$_3$, —O(CH$_2$)$_6$CH$_3$, —O(CH$_2$)$_7$CH$_3$, —O(CH$_2$)$_8$CH$_3$, —O(CH$_2$)$_9$CH$_3$, and —NHCH$_3$, —NHCH$_2$CH$_3$, —NH(CH$_2$)$_2$CH$_3$, —NHCH(CH$_3$)$_2$, —NH(CH$_2$)$_3$CH$_3$, —NH(CH$_2$)$_4$—CH$_3$, —N(CH$_3$)$_2$, —N(CH$_3$)CH$_2$CH$_3$, —N(CH$_3$)(CH$_2$)$_2$CH$_3$, —N(CH$_3$)CH(CH$_3$)$_2$, —N(CH$_2$CH$_3$)$_2$, —N(CH$_2$CH$_3$)((CH$_2$)$_2$CH$_3$), and —N(CH$_2$CH$_3$)(CH(CH$_3$)$_2$).

In at least one embodiment, the polymer comprises "n" repeating units of the poly formula [II]

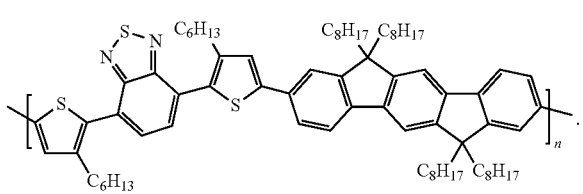

When the word "polymer" is used, herein, the word polymer may refer to poly formula [I], poly formula [II], poly formula [III], or poly formula [IV]. The word "polymer," as used herein, may also refer to the formed polymer.

The polymer may act as a conductive polymer. A conductive polymer is a polymer that may be thermally, electrically, or photoelectrically conductive. A conjugated polymer, also called a i-conjugated polymer, may be a conductive polymer. Conjugated polymers have backbones of contiguous sp$^2$ hybridized atom centers, and the electrons in these delocalized orbitals have high mobility when the material is oxidatively doped. Oxidative doping is removing some of the delocalized electrons, making the resulting polymer a p-type material. In at least one embodiment, the polymer is a p-type polymer. In at least one embodiment, the polymer has an electrical conductivity ranging from $10^{-10}$ to $10^7$ S/m.

Some conjugated polymers may also be conductive polymers because of the electrons in the delocalized orbitals. Alternatively, some conjugated polymers may act as semiconductors, meaning that they have a low electrical conductivity. The low electrical conductivity may, for example, be in the range of $10^{-10}$ to $10^{-8}$ S/cm. Also, the low electrical conductivity may, for example, be increased by doping. Alternatively, the low electrical conductivity may, for example, be increased without doping. For example, increases in conductivity can also be accomplished in a field effect transistor (organic FET or OFET) and by irradiation. Doping conductive polymers may include oxidizing or reducing the polymer. Alternatively, a conductive polymer associated with a protic solvent may be "self-doped." The protic solvent may include, for example, water, ethanol, methanol, isopropanol, acetic acid, or formic acid.

The polymer may have one or more optoelectronic properties. These optoelectronic properties may result from a small band gap ranging from 0.1 eV to 6 eV, for example ranging from 0.3 eV to 3 eV. Optoelectronic properties may, for example, include the absorption, transmission, or emission of light.

In one aspect, the polymer is capable of absorbing light ranging from 100 nm to 3,000 nm. In at least one embodiment, the polymer is capable of absorbing light within the visible spectrum. This may be seen in FIG. 1, which shows an absorbance profile of poly-1.

In at least one embodiment, the polymer has an absorption with an onset at around 600 nm. The polymer may have a single, double, triple, or more maxima absorption. The absorption may, for example, have a maxima ranging from 310 nm to 330 nm, 380 nm to 410 nm, and/or 440 nm to 470 nm. The polymer may, for example, have a maximum at about 318 nm, about 390 nm, and about 455 nm.

In at least one embodiment, the polymer a number average molecular weight, Mn, in the range of from 16,000 to 500,000 Daltons (Da), for example, ranging from 16,000 to 300,000 Da; ranging from 16,000 to 200,000 Da; ranging from 16,000 to 100,000 Da; or ranging from 16,000 to 50,000 Da In at least one embodiment, the polymer may have a number average molecular weight, Mn, ranging from 16,000 to 25,000 Da, for example, ranging from 18,000 to 24,000 Da; ranging from 20,000 to 23,000 Da; or ranging from 20,000 to 22,000 Da.

In one aspect, the polymer may have a weight average molecular weight, Mw, ranging from 25,000 to 800,000 Da; for example, ranging from 25,000 to 500,000 Da; ranging from 25,000 to 300,000 Da; ranging from 25,000 to 200,000 Da; or ranging from 25,000 to 100,000 Da.

In a further embodiment, the polymer may have a weight average molecular weight, Mw, ranging from 25,000 to 75,000 Da, for example, ranging from 35,000 to 65,000 Da, or ranging from 45,000 to 55,000 Da.

The polydispersity index (PDI) or heterogeneity index, is a measure of the distribution of molecular mass in a given polymer sample. The PDI has a value equal to or greater than 1, but as the polymer chains approach uniform chain length, the PDI approaches unity (1). The polymer may have a PDI ranging from 2.0 to 2.5, for example, ranging from 2.1 to 2.45, ranging from 2.15 to 2.4, or ranging from 2.20 to 2.35.

In at least one embodiment, the polymer is an article of manufacture. For example, the article of manufacture may comprise the polymer comprising "n" repeating units of the poly formula [II].

In a further embodiment, the article is selected from organic solar cells, flexible electronics, logic and memory devices, printing electronic circuits, organic light-emitting diodes, actuators, electrochromism, supercapacitors, chemical sensors and biosensors, flexible transparent displays, and electromagnetic shielding. In at least one embodiment, the article is a semiconductor. In another embodiment, the article is a conductor. In yet another embodiment, the article is a solar cell and flexible electronics such as a flexible solar cell.

The article may be produced using conventional methods. In at least one embodiment, the article is a solar cell or flexible electronic devices and may be produced using conventional methods.

A method for preparing a polymer comprises
providing a monomer of general formula [1]:

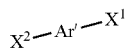

[1]

wherein Ar' is selected from phenyl and heteroaryl, and independently substituted with one or more groups independently selected from C1-C18 alkyl, C1-C18 alkoxy, C1-C18 alkylamino, C1-C18 dialkylamino, $Cy^1$, $Cy^1$-(C1-C18 alkyl)-, $Ar^1$, and $Ar^1$—(C1-C18 alkyl)-;

wherein Ar' may optionally be fused with one or more groups selected from phenyl, heteroaryl, or $Cy^1$;

wherein two or more substituents on Ar' may optionally be covalently bonded to form a 3- to 17-membered cycloalkyl or, together with 1-3 heteroatoms, comprise a 4- to 17-membered heterocycloalkyl;

wherein $Ar^1$ is selected from phenyl and heteroaryl, and independently substituted with 0, 1, 2, 3, or 4 groups independently selected from C1-C18 alkyl, C1-C18 alkoxy, C1-C18 alkylamino, and C1-C18 dialkylamino;

wherein $Cy^1$ is selected from C3-C18 cycloalkyl and C2-C17 heterocycloalkyl, and substituted with 0, 1, 2, 3, or 4 groups independently selected from C1-C18 alkyl, C1-C18 alkoxy, C1-C18 alkylamino, and C1-C18 dialkylamino; and wherein each of $X^1$ and $X^2$ is independently selected from halogen, triflates, nonaflates, fluorosulfonates, tosylates, mesylates, nitrates, phosphates, oxonium ions, diazonium salts, ammonium salts, alcohols, and ethers;

providing a monomer of general formula [2]:

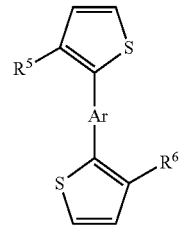

[2]

wherein Ar is selected from phenyl, heteroaryl, fused aryl, fused heteroaryl, and an aryl fused with a heteroaryl; and independently substituted with 0, 1, 2, 3, or 4 groups independently selected from C1-C18 alkyl, C1-C18 alkoxy, C1-C18 alkylamino, and C1-C18 dialkylamino; and wherein each of $R^5$ and $R^6$ is independently selected from C1-C18 alkyl, C1-C18 alkoxy, C1-C18 monoalkylamino, C1-C18 dialkylamino, $Cy^1$, $Cy^1$-(C1-C18 alkyl)-, $Ar^1$, $Ar^1$—(C1-C18 alkyl)-, —(C1-C18 alkyl)-(C=O)$R^7$, —(C1-C18 alkyl)-(C=O)O$R^7$, —(C1-C18 alkyl)-S(O)$_m$$R^7$, -(C=O)$R^7$, -(C=O)O$R^7$, and —S(O)$_m$$R^7$; and wherein $R^7$ is selected from C1-C18 alkyl, C1-C18 alkoxy, C1-C18 monoalkylamino, C1-C18 dialkylamino; and reacting the monomer of formula [1] and monomer of formula [2] in the presence of a transition metal catalyst under conditions effective to form a polymer comprising "n" repeating units of poly formula [IV]:

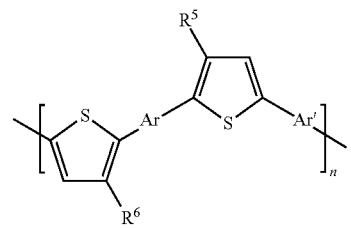

[IV]

In at least one embodiment, a method for preparing a polymer comprises providing a monomer of general formula [1]:

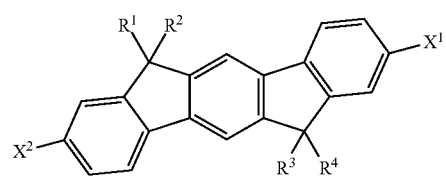

[1]

wherein each of $R^1$ and $R^2$ is independently selected from C1-C18 alkyl, C1-C18 alkoxy, $Cy^1$, $Cy^1$-(C1-C18 alkyl)-, $Ar^1$, and $Ar^1$—(C1-C18 alkyl)-;

wherein $R^1$ and $R^2$ are optionally covalently bonded to form a 3- to 17-membered cycloalkyl or, together with 1-3 heteroatoms, comprise a 4- to 17-membered heterocycloalkyl;

wherein each of $R^3$ and $R^4$ is independently selected from C1-C18 alkyl, C1-C18 alkoxy, $Cy^1$, $Cy^1$-(C1-C18 alkyl)-, $Ar^1$, and $Ar^1$—(C1-C18 alkyl)-;

wherein $R^3$ and $R^4$ are optionally covalently bonded to form a 3- to 17-membered cycloalkyl or, together with 1-3 heteroatoms, comprise a 4- to 17-membered heterocycloalkyl;

wherein $Ar^1$ is selected from phenyl and heteroaryl, and independently substituted with 0, 1, 2, 3, or 4 groups independently selected from C1-C18 alkyl, C1-C18 alkoxy, C1-C18 alkylamino, and C1-C18 dialkylamino;

wherein $Cy^1$ is selected from C3-C18 cycloalkyl and C2-C17 heterocycloalkyl, and substituted with 0, 1, 2, 3, or 4 groups independently selected from C1-C18 alkyl, C1-C18 alkoxy, C1-C18 alkylamino, and C1-C18 dialkylamino; and wherein each of $X^1$ and $X^2$ is independently selected from halogen, triflates, nonaflates, fluorosulfonates, tosylates, mesylates, nitrates, phosphates, oxonium ions, diazonium salts, ammonium salts, alcohols, and ethers;

providing a monomer of general formula [2]:

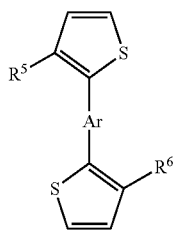

[2]

wherein Ar is selected from phenyl, heteroaryl, fused aryl, fused heteroaryl, and an aryl fused with a heteroaryl; and independently substituted with 0, 1, 2, 3, or 4 groups independently selected from C1-C18 alkyl, C1-C18 alkoxy, C1-C18 alkylamino, and C1-C18 dialkylamino; and wherein each of $R^5$ and $R^6$ is independently selected from C1-C18 alkyl, C1-C18 alkoxy, C1-C18 monoalkylamino, C1-C18 dialkylamino, $Cy^1$, $Cy^1$-(C1-C18 alkyl)-, $Ar^1$, $Ar^1$—(C1-C18 alkyl)-, —(C1-C18 alkyl)-(C=O)$R^7$, —(C1-C18 alkyl)-(C=O)O$R^7$, —(C1-C18 alkyl)-S(O)$_m R^7$, —(C=O)$R^7$, —(C=O)O$R^7$, and —S(O)$_m R^7$; and wherein $R^7$ is selected from C1-C18 alkyl, C1-C18 alkoxy, C1-C18 monoalkylamino, C1-C18 dialkylamino; and reacting the monomer of formula [1] and monomer of formula [2] in the presence of a transition metal catalyst under conditions effective to form a polymer comprising "n" repeating units of poly formula [III]:

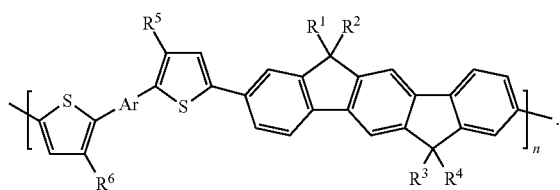

[III]

In another embodiment, the monomer of general formula [2] comprises the general formula:

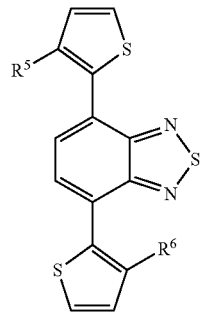

wherein reacting the monomer of formula [1] and monomer of formula [2] in the presence of a transition metal catalyst forms a polymer comprising "n" repeating units of poly formula [I]:

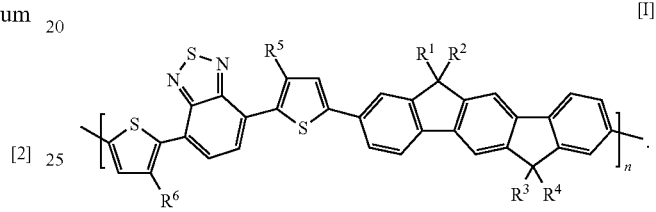

[I]

In a further embodiment of the method, $R^1$, $R^2$, $R^3$, and $R^4$ are independently selected from C1-C18 alkyl, C1-C18 alkoxy;

$R^5$ and $R^6$ are independently selected from C1-C18 alkyl, —(C1-C18 alkyl)-(C=O)$R^7$, —(C1-C18 alkyl)-(C=O) O$R^7$, —(C1-C18 alkyl)-S(O)$_m R^7$, —(C=O)$R^7$, —(C=O) O$R^7$, and —S(O)$_m R^7$; and $R^7$ is C3-C18 alkyl.

In at least one embodiment, each of $X^1$ and $X^2$ is independently selected from halogen, for example, bromine, iodine, chlorine, and fluorine; triflates, for example R—OSO$_2$CF$_3$; nonaflates, for example, R—OSO$_2$C$_4$F$_9$; fluorosulfonates, for example, R—SO$_2$F; tosylates, for example, R—OSO$_2$C$_6$H$_4$CH$_3$; mesylates, for example, R—OSO$_2$CH$_3$; nitrates, R—ONO$_2$; phosphates, R—OPO(OH)$_2$; oxonium ions, for example, R—OR'$^+$; diazonium salts, for example, R—N$_2^+$; ammonium salts, for example, R—NR'$_3$, alcohols, for example, R—OH or R—OH$_2$; and ethers, for example, R—OR' or R—OHR'$^+$. In at least one embodiment, R is a monomer of general formula [1]. In other words, R is used to indicate where the functional group of each of $X^1$ and $X^2$ are attached to the monomer. In at least one embodiment, R' may be hydrogen or an alkyl chain with three to eighteen carbon atoms. In another embodiment, R' may optionally include one or more heteroatom, such as oxygen, nitrogen, sulfur, or phosphorous. In a further embodiment, R' may optionally include one or more functional groups, for example, ketone, ether, amide, amine, ester, carboxylic acid, thiol, alcohol, or sulfate.

In at least one embodiment, the $R^5$ and $R^6$ are chosen to prevent bond formation at the β-position on the thiophene monomer of formula [1], forming a polymer with high regioregularity. In at least one embodiment, the reaction occurs primarily at the α-position on the thiophene monomer of formula [1]. In at least one embodiment, some side reaction occurs at the β-position on the thiophene monomer of formula [1]. In at least one embodiment, substantially all the reaction occurs at the α-position on the thiophene monomer of formula [1]. In at least one embodiment, a negligible amount of bond formation occurs at the β-position on the thiophene monomer of formula [1].

In at least one embodiment, the monomer of formula [1] has the structure:

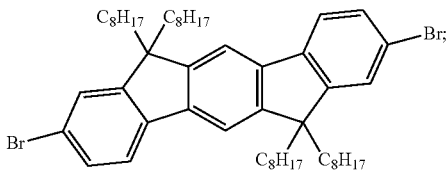

the monomer of formula [2] has the structure:

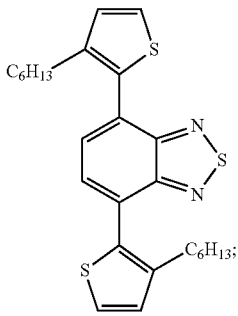

and
reacting the monomer of formula [1] and monomer of formula [2] in the presence of a transition metal catalyst forms a polymer comprising "n" repeating units of poly formula [II]

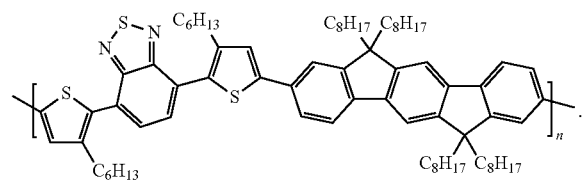

The transition metal catalyst may include any transition metal effective to catalyze the formation of poly formula [I], poly formula [II], poly formula [III], or poly formula [IV]. The transition metal catalyst may be coordinated with at least one ligand. The at least one ligand includes any ligand which allows the transition metal to effectively catalyze the formation of poly formula [I], poly formula [II], poly formula [III], or poly formula [IV]. At least one ligand may, for example, be selected from an acetoxy group (OAc), a phosphine ligand, such as $PPh_3$, or a halogen, such as bromine, chlorine, iodine, or fluorine. The transition metal may be selected from, for example, Fe, Ni, Cu, Ru, Pd, Os, and Au. For example, possible transition metal catalysts may include $Pd(OAc)_2$ and $Pd(PPh_3)_4$, $PdCl_2$, $NiCl_2$, or $NiBr_2$. In at least one embodiment, the transition metal catalyst is phosphine-free.

In at least one embodiment, the method comprising the reacting of the monomers of formula [1] and [2] under conditions effective to form the polymer comprises carbon-hydrogen bond activation. This reaction may also be known as direct arylation. In at least one embodiment, the carbon-hydrogen bond on the monomer of formula [2] is activated by the catalyst. Then, $X^1$ and $X^2$ act as leaving groups on the monomer of formula [1], allowing a bond to form between the carbon on the monomer of formula [1] and the carbon on the monomer of formula [2].

In one aspect, the method does not comprise the step of adding and then subsequently removing a leaving group to the monomer of formula [2]. Typically, reactions use leaving groups that would be added and then subsequently removed from the carbon of monomer of formula [2]. The leaving group would be then subsequently removed by formation of the carbon bond during the reaction of monomer [2] with monomer [1]. This typical reaction condition may be found in conventional Suzuki reaction conditions or conventional Stillie reaction conditions. In other words, the reacting to form the polymer does not comprise the step of adding and then subsequently removing a leaving group as in conventional Suzuki reaction conditions or conventional Stillie reaction conditions. The leaving group is selected from boron compounds, tin compounds, silica compounds, lithium compounds, nitrogen compounds, phosphorus compounds, or magnesium compounds. Typical reactions using these leaving groups produce additional waste, often at least a stoichiometric amount, and additional costs from the preparation and subsequent removal of the leaving group. These leaving groups, for example tin, may also be toxic. As such, forming the polymer by activation of the carbon-hydrogen bond without using a leaving group may be beneficial for reducing cost, waste, and toxicity. In other words, this process may be considered an efficient, cost effective, and environmentally friendly process.

The polymer may also have beneficial mechanical properties, such as mechanical flexibility, impact resistance, and optical transparency.

In at least one embodiment, the reaction takes place in one vessel. Since the typical reaction conditions involve the step of adding and then subsequently removing a leaving group to the monomer of formula [2], the typical reaction takes place in multiple vessels. As such, forming the polymer by activation of the carbon-hydrogen bond without using a leaving group on the monomer of formula [2] may also be beneficial because of the reduced reaction steps, the reduced reaction vessels, and the improved reaction simplicity.

In at least one embodiment, the $R^5$ and $R^6$ on the thiophene improve the polymer's solubility. The improved solubility may include being more soluble in organic solvents or being more soluble in aqueous solvents, depending on the $R^5$ and $R^6$ groups chosen. The polymer's improved solubility may allow for greater processability of the polymer during and after the synthesis.

The reaction to form the polymer may be performed in various organic or aqueous solvents. For example, the aqueous solvent may be all water or partially comprise water. The aqueous solvent may also comprise salt or other soluble ingredients in addition to water. For example, organic solvents may include polar and non-polar solvents. Further for example, the organic solvent may include dimethylacetamide (DMA), dimethylformamide (DMF), or tetrahydrofuran (THF). In one aspect, the organic solvent may comprise an amide functional group, an amine functional group, an alcohol group, or an ester group. For example, the organic solvent may be chosen from glycol, dimethoxyethane (DME), and pyridine. The organic solvent may be a single organic solvent or a mixture of two or more organic solvents. The solvent may also be a mixture of organic and aqueous solvents, for example ethanol and water.

In at least one embodiment, the polymer formed is soluble in an organic solvent during formation and after formation. In at least one embodiment, the improved polymer solubility allows for greater processability in forming an article. In at least one embodiment, $R^5$ and $R^6$ are both chosen to be $C_6H_{13}$, which improves the polymer's solubility and allows for greater processability of the polymer during and after synthesis. In at least one embodiment, the improved solubility from the $R^5$ and $R^6$ also improves the carbon-hydrogen bond activation reaction to form the polymer.

In at least one embodiment, the condition effective to form the polymer may comprise the transition metal catalyst and the reactants. Additional ingredients may be used, which may possibly accelerate or facilitate the reaction conditions or purification. Additional ingredients may include, for example, salt or acid. For example, salts may include alkali salts of carbonate, phosphate, tert-butoxide, and hydroxide. In at least one embodiment, the salt may include potassium carbonate, sodium carbonate, calcium hydroxide, magnesium hydroxide, or sodium chloride. In at least one embodiment, the acid may be a carboxylic acid. For example, the carboxylic acid may include formic acid, oxalic acid, citric acid, pivalic acid, propanoic acid, or acetic acid.

In at least one embodiment, the conditions effective to form the polymer comprise a total reaction time of less than 72 hours. In another embodiment, the conditions effective to form the polymer comprise a total reaction time of less than 12 hours, for example a range of 1 minute to 4 hours.

In at least one embodiment, the reacting to form the polymer is effective to provide the polymer in an isolated yield that ranges from 50% to 99%, for example ranges from 50% to 90%. In a further embodiment, the isolated yield ranges from 70% to 99%, for example ranges from 70% to 90%.

The disclosed polymer may further optionally comprise one or more additives conventionally used in the manufacture of polymer resin with the proviso that the additives do not significantly adversely affect the desired properties of the resulting composite. Mixtures of additives may also be used. Such additives may be mixed at a suitable time during the mixing of the components for forming the composite mixture. For example, the disclosed composites can comprise one or more fillers, stabilizers, flame-retardants, impact modifiers, colorant, and/or mold release agents.

Still further, the resulting polymer can be used to provide any desired shaped, formed, or molded articles. For example, the polymer may be molded into useful shaped articles by a variety of means such as injection molding, extrusion, rotational molding, blow molding, and thermoforming. As noted above, the disclosed polymer is particularly well suited for use in the manufacture of semiconductors, solar cells, and electronic components and devices. As such, according to some embodiments, the disclosed composites can be used to form articles such as printed circuit board carriers, burn in test sockets, flex brackets for hard disk drives, and the like.

EXAMPLES

The following examples are put forth so as to provide those of ordinary skill in the art with a complete disclosure and description of how the compositions disclosed and claimed herein can be made and evaluated, and are intended to be purely exemplary and are not intended to limit the disclosure. Efforts have been made to ensure accuracy with respect to numbers (e.g., amounts, temperature, etc.), but some errors and deviations should be accounted for. Unless indicated otherwise, parts are parts by weight, temperature is in C or is at ambient temperature, and pressure is at or near atmospheric.

Example 1

Synthesis and Characterization of a Polymer of Poly Formula [I]: Poly-1

In the following example, a polymer of poly formula [I] was synthesized and compared to a polymer synthesized using a different synthetic pathway.

Scheme 1: Synthesis of a polymer of poly formula [I]: poly-1

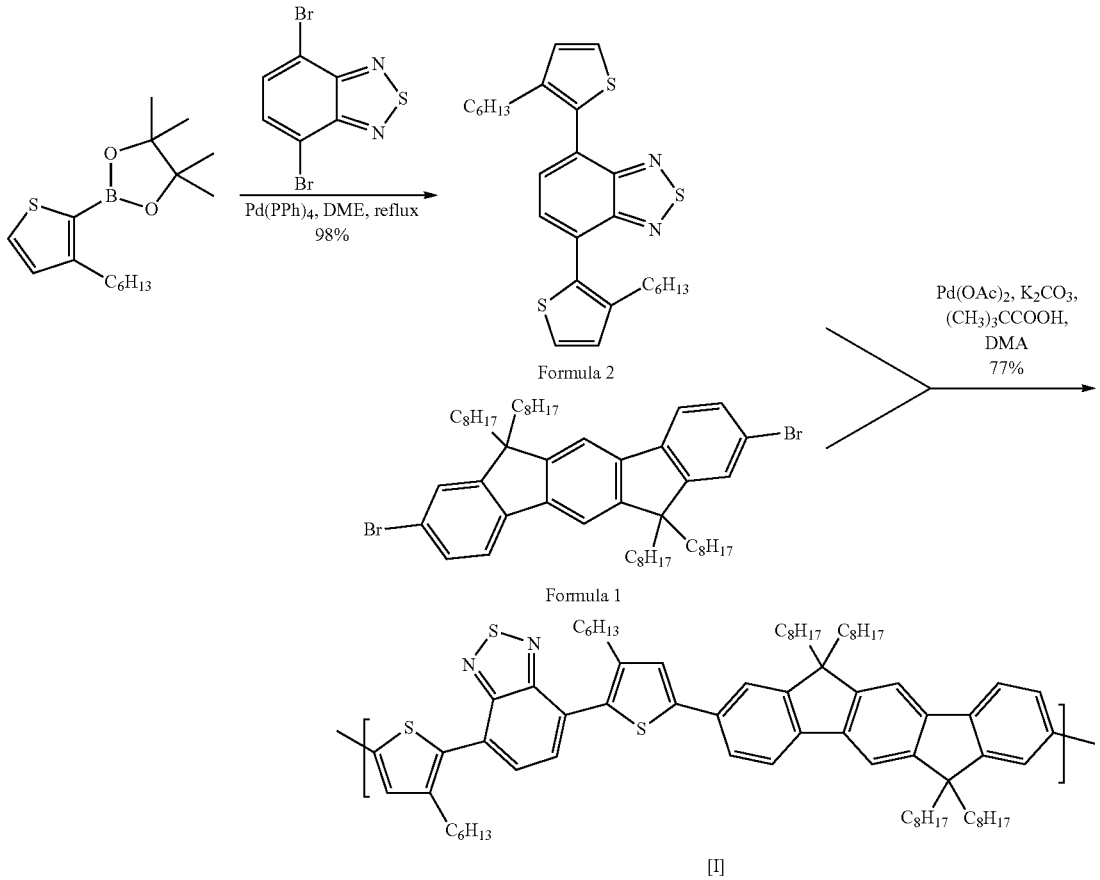

4,7-Dibromobenzo[c]-1,2,5-thiadiazole (1.00 g, 3.41 mmol) and 3-hexylthiophene-2-boronic acid pinacol ester (2.10 g, 7.14 mmol) were placed in a 100 mL 3-neck round bottom flask which was flushed with $N_2$ gas for 5 minutes. Dimethoxyethane (20 mL) and water (30 mL) were added and the mixture was purged with $N_2$ gas for 30 minutes. Sodium carbonate (4.23 g, 34.1 mmol) and catalyst $Pd(PPh_3)_4$ (0.430 g, 0.372 mmol) were added and the mixture was heated to 100° C. and stirred for 12 hours. The mixture was extracted into hexanes and passed through a silica column, by eluting first with hexanes (200 mL) and then eluting the product with a solution of 5% EtOAc in hexanes (200 mL). The procedure afforded 1.59 g of vibrant orange, 4,7-bis(3-hexylthiophen-2-yl)benzo[c][1,2,5]thiadiazole (Formula 2) in 99% yield.

Figure 2:
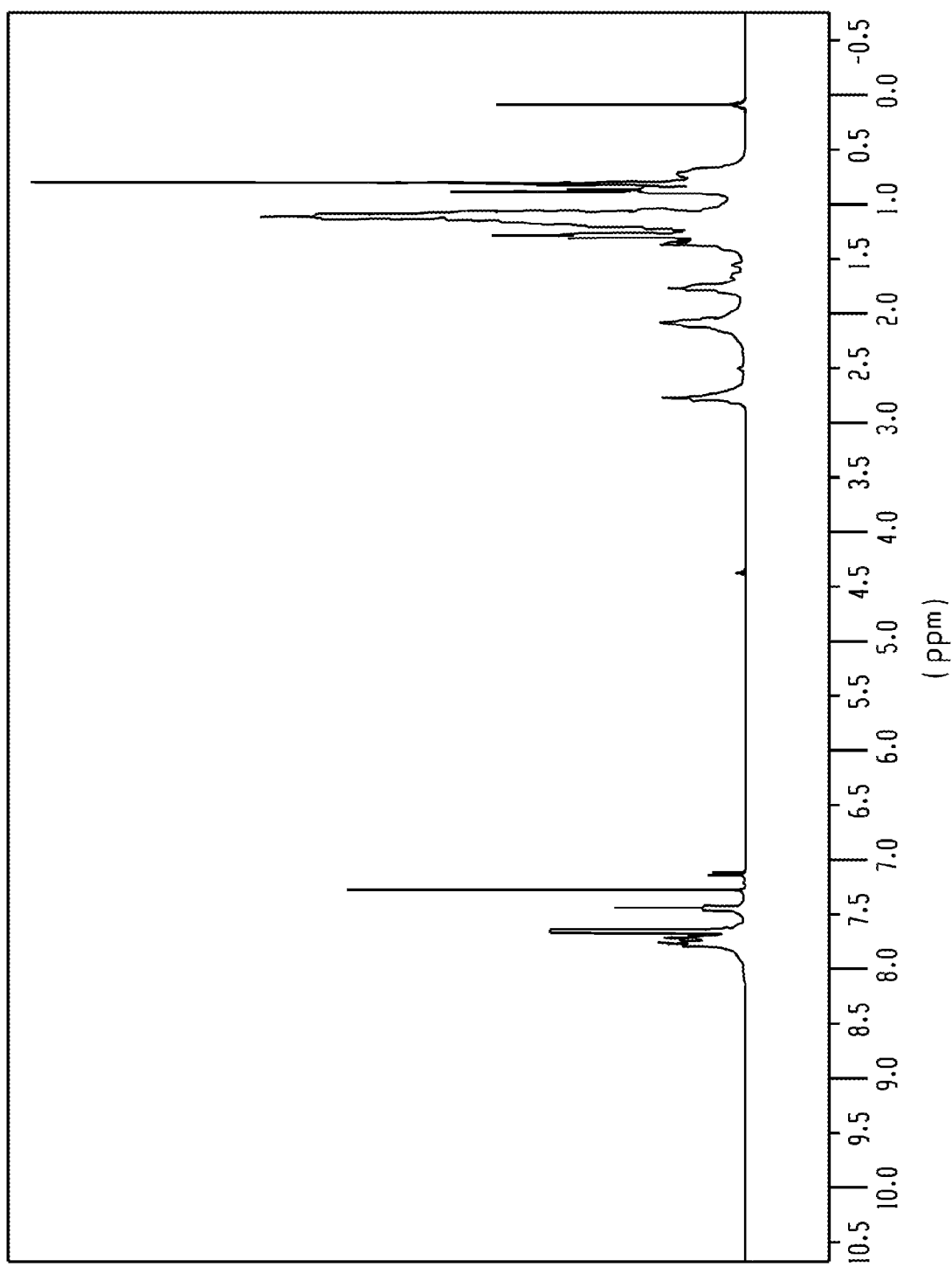
FIG. 2 is a $^1$H-NMR of a polymer of poly formula [II].

A mixture of $Pd(OAc)_2$ (2.6 mg, 0.012 mmol), pivalic acid (17.6 mL, 0.172 mmol), $K_2CO_3$ (207 mg, 1.50 mmol), 2,8-Dibromo-6,12-dihydro-6,6,12,12-tetraoctyl-indeno[1,2-b]fluorine (Formula 1) (498 mg, 0.576 mmol), and 4,7-bis(3-hexylthiophen-2-yl)benzo[c][1,2,5]thiadiazole (Formula 2) (230 mg, 0.576 mmol) was stirred in anhydrous dimethylacetamide (1.9 mL) for 3 h at 105° C. under nitrogen atmosphere. After cooling to room temperature, the mixture was poured into water. The suspension was stirred overnight at room temperature. The precipitate was separated by filtration and washed with distilled water and then purified by Soxhlet extraction using methanol, hexanes, and chloroform. The chloroform fraction was concentrated to give poly-1 as a red solid (524 mg, 77%). As can be seen in FIG. 2, $^1$H-NMR (400 MHz, $CDCl_3$): δ 7.79 (m, 10H), 7.46 (m, 2H), 2.77 (m, 4H), 2.08 (br, 8H), 1.75 (m, 4H), 1.37-0.79 (m, 74H). Mn=21,900; PDI=2.46; Mw=50100 Da.

Poly-1 absorbs light within the visible spectrum with an onset at around 600 nm and maxima at 318, 390, and 455 nm (FIG. 1).

Poly-1 has a reversible oxidation at +0.57 V vs. ferrocene, which corresponds to a HOMO level of −5.47 eV.

Poly-1 undergoes an electrochemical reduction at −1.4 V vs. ferrocene, which corresponds to a LUMO of −3.50 eV.

Poly-1, which includes a hexyl group on the thiophene, has improved solubility compared to a similar polymer without the hexyl group on the thiophene.

The synthesis in scheme 1 uses C—H activation rather than a Suzuki method. The different methods produce different polymers, as can be seen in Table 1 below.

TABLE 1

Comparative analysis between C—H activation and traditional cross coupling methods based on literature expected values*

| | Method: | |
|---|---|---|
| | Suzuki | C—H activation |
| Mn(Da): | 14,200 | 21,900 |
| PDI: | 2.65 | 2.29 |
| Yield: | 43% | 77% + (23% lower Mn poly.) |
| Solvent ratio: | 35× | 1× (about 4 mL/g) |
| Catalyst: | $Pd(PPh_3)_4$ (unstable to air) 5 mol % (25× by mass) | $Pd(II)(OAc)_2$ 2 mol % |
| Time: | 48 h | 3 h |
| Temperature: | 95° C. | 105° C. |
| Work up: | complex multi-step | 1 vessel |

*Howard Katz et al. J. Am. Chem. Soc. 2010, 132, 5394.

As can be seen in Table 1, the polymer produced by the C—H activation method has a higher Mn compared to the Mn of a polymer produced by the Suzuki method. Also, the polymer produced by the C—H activation method has narrower PDI, meaning a lower PDI, compared to a polymer produced by the Suzuki method. By having a narrower PDI, the polymer produced by the C—H activation also has more polymer chains with uniform chain length than the polymer produced by the Suzuki method.

Example 2

Photovoltaic Device Fabrication

Indium tin oxide (ITO) coated glass substrates (Colorado Concept Coatings LLC) were ultrasonicated in aqueous detergent, deionized water, acetone, and methanol for 5 minutes each, then treated in an oxygen-plasma cleaner for 5 minutes. A thin layer of poly(3,4-ethylenedioxythiophene):poly(styrene sulfonic acid) (PEDOT:PSS) was then spin-coated onto the ITO glass at 3000 rpm for 30 seconds, and annealed in air at 130° C. for 15 min. Poly 1 (P1) and [6,6]-phenyl $C_{71}$ butyric acid methyl ester (PC71BM) were dissolved in 1,2-dichlorobenzene (6-10 mg/mL P1 and 10-40 mg/mL PC71BM). 1-chloronaphthalene (CN) was added to the mixtures at varied concentrations (0-5% v/v). All mixtures were stirred at 80° C. for 20 h to ensure complete dissolution of the solids. The P1/PC71BM solution was spin-coated on top of the PEDOT:PSS layer at 800 rpm in a nitrogen-filled glove box, and subsequently kept in a nitrogen-filled glove box at room temperature for 48 h until the film was dry. No annealing step was used, although annealing is commonly performed. LiF (0.8 nm) and Al (100 nm) were thermally evaporated using an Angstrom Engineering (Kitchener, ON) Covap II metal evaporation system at $1\times10^{-6}$ torr. The device area was 0.07 $cm^2$ as defined by a shadow mask. Voltage-current characteristics (I-V curves) were obtained using a Keithley 2400 source meter under simulated ASTM AM 1.5 G conditions with a power intensity of 100 mW/$cm^2$. The mismatch of similar spectrum was calibrated using a Si diode with a KG-5 filter. External quantum efficiency (EQE) measurements were recorded using a 300 Watt Xenon lamp with an Oriel Cornerstone 260 ¼ m monochromator and compared with a Si reference cell that is traceable to the National Institute of Standards and Technology.

Devices made using the procedure as generally described above were further tested under the conditions below. In Tables 2-4, "Jsc" is short circuit current density; "$V_{OC}$" is the open-circuit voltage, the difference of electrical potential between two terminals of a device when disconnected from any circuit; and "FF" is the fill factor.

Figure 3A:
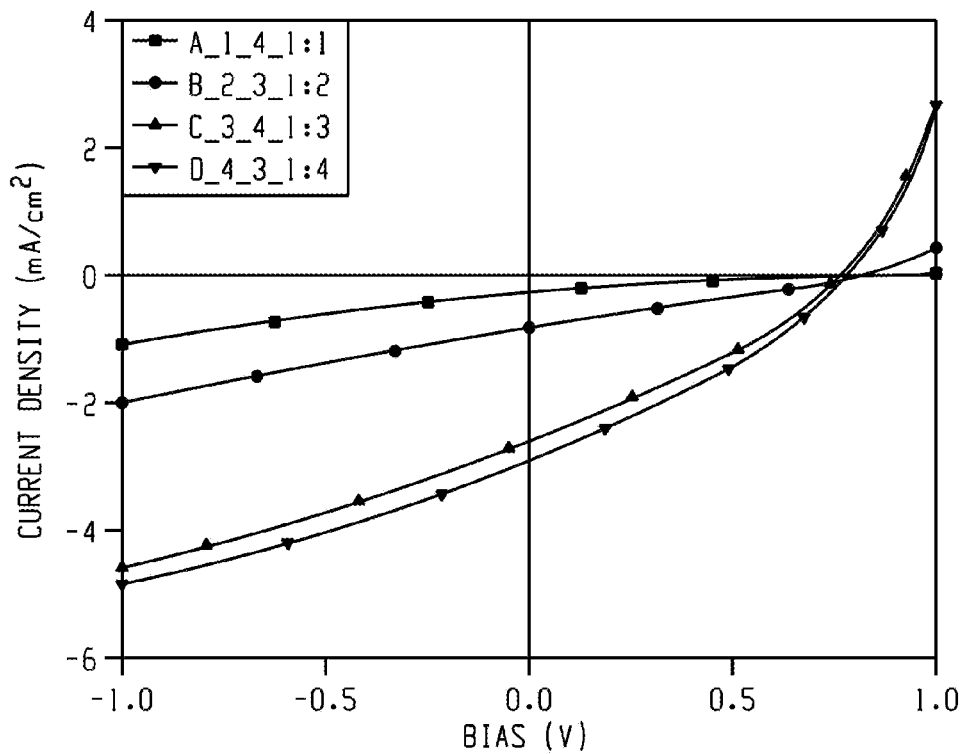
FIG. 3A is a graph showing current-voltage (I-V) curves at different ratios and FIG. 3B is a graph showing external quantum efficiency (EQE) vs. wavelength at different ratios.
Figure 3B:
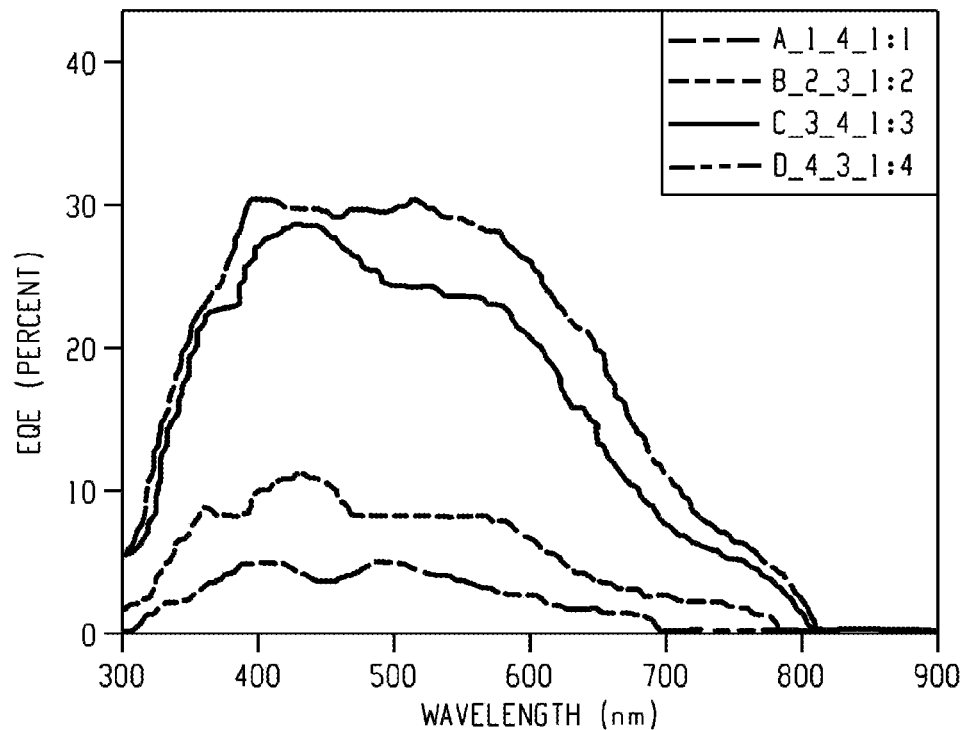

The effect of varying donor to acceptor ratio is shown in FIG. 3A and FIG. 3B. The parameters for devices A-D are as follows. Data is shown in Table 2.

Device A ITO/PEDOT:PSS/P1:PC71BM(1:1)/LiF(0.8 nm)/Al(100 nm)

Device B ITO/PEDOT:PSS/P1:PC71BM(1:2)/LiF(0.8 nm)/Al(100 nm)

Device C ITO/PEDOT:PSS/P1:PC71BM(1:3)/LiF(0.8 nm)/Al(100 nm)

Device D ITO/PEDOT:PSS/P1:PC71BM(1:4)/LiF(0.8 nm)/Al(100 nm)

TABLE 2

| Device | Conc. mg/mL | Spin Speed rpm | $J_{SC}$ mA/cm² | $V_{OC}$ V | FF (ave.) % | PCE (ave.) % | EQE (ave.) % |
|---|---|---|---|---|---|---|---|
| A | 10:10 | 800 | 3.55 | 0.98 | 21.2 | 0.74 | 4.62 |
| B | 10:20 | 800 | 4.05 | 0.84 | 27.8 (27.6) | 0.95 (0.94) | 10.9 (10.1) |
| C | 10:30 | 800 | 4.27 | 0.78 | 32.7 (31.9) | 1.09 (1.06) | 28.9 (24.9) |
| D | 10:40 | 800 | 4.20 | 0.80 | 33.0 (32.9) | 1.11 (1.11) | 30.7 (29.2) |

Figure 4A:
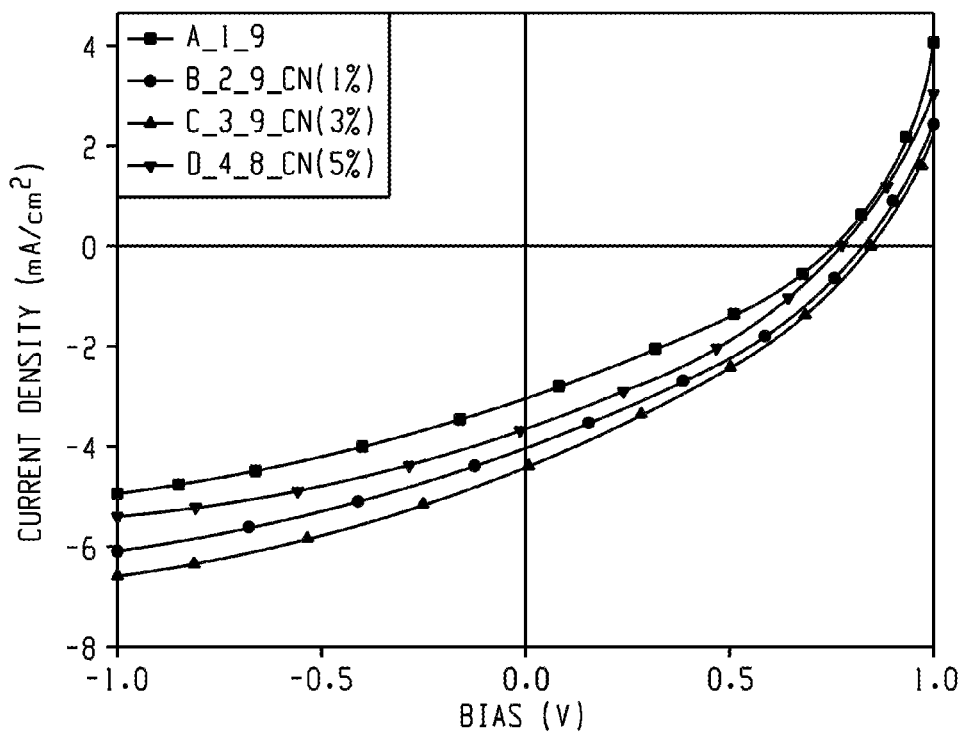
FIG. 4A is a graph showing current-voltage (I-V) curves at different ratios and FIG. 4B is a graph showing external quantum efficiency (EQE) vs. wavelength at different ratios.
Figure 4B:
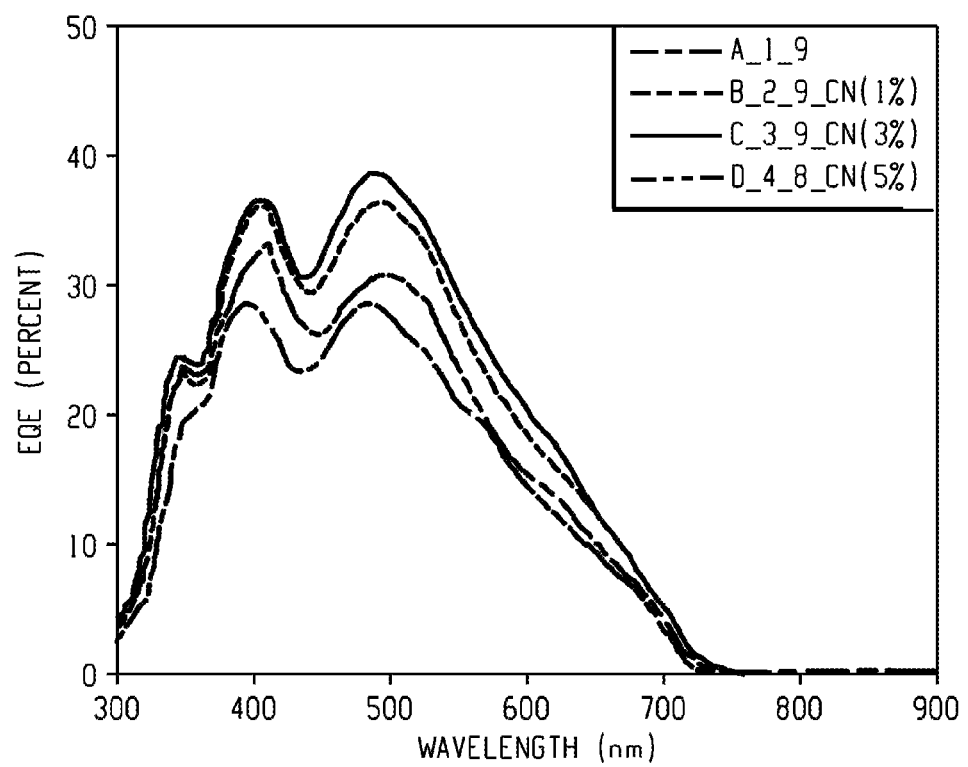

The effect of 1-chloronaphthalene concentration is shown in FIG. 4A and FIG. 4B. The parameters for devices A-D are as follows. Data is shown in Table 3.
Device A ITO/PEDOT:PSS/P1:PC71BM/LiF(0.8 nm)/Al (100 nm)
Device B ITO/PEDOT:PSS/P1:PC71BM_CN(1%)/LiF (0.8 nm)/Al(100 nm)
Device C ITO/PEDOT:PSS/P1:PC71BM_CN(3%)/LiF (0.8 nm)/Al(100 nm)
Device D ITO/PEDOT:PSS/P1:PC71BM_CN(5%)/LiF (0.8 nm)/Al(100 nm)

TABLE 3

| Device | Conc. mg/mL | Spin Speed rpm | $J_{SC}$ mA/cm² | $V_{OC}$ V | FF (ave.) % | PCE (ave.) % | EQE (ave.) % |
|---|---|---|---|---|---|---|---|
| A | 6:24 | 800 | 2.95 | 0.80 | 30.4 (32.2) | 0.72 (0.56) | 28.8 (25.5) |
| B | 6:24 | 800 | 4.08 | 0.84 | 32.8 (32.4) | 1.13 (1.02) | 36.7 (34.7) |
| C | 6:24 | 800 | 4.39 | 0.84 | 33.4 (33.1) | 1.23 (1.06) | 38.7 (35.0) |
| D | 6:24 | 800 | 3.56 | 0.80 | 33.6 (32.0) | 0.98 (0.93) | 33.2 (33.4) |

Figure 5A:
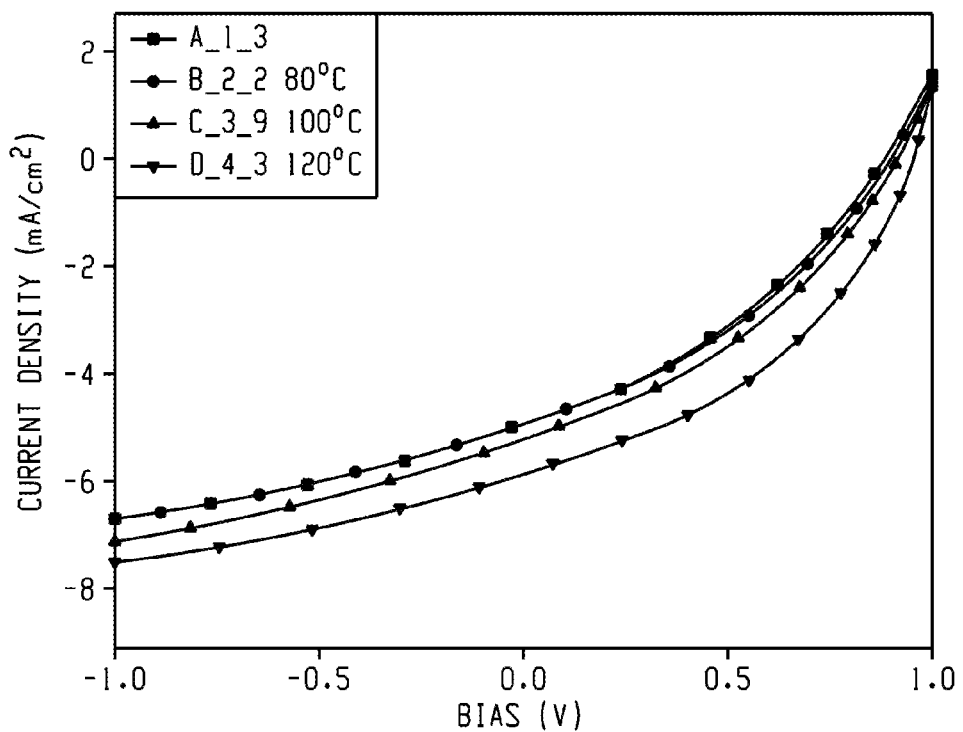
FIG. 5A is a graph showing current-voltage (I-V) curves at different ratios and FIG. 5B is a graph showing external quantum efficiency (EQE) vs. wavelength at different ratios.
Figure 5B:
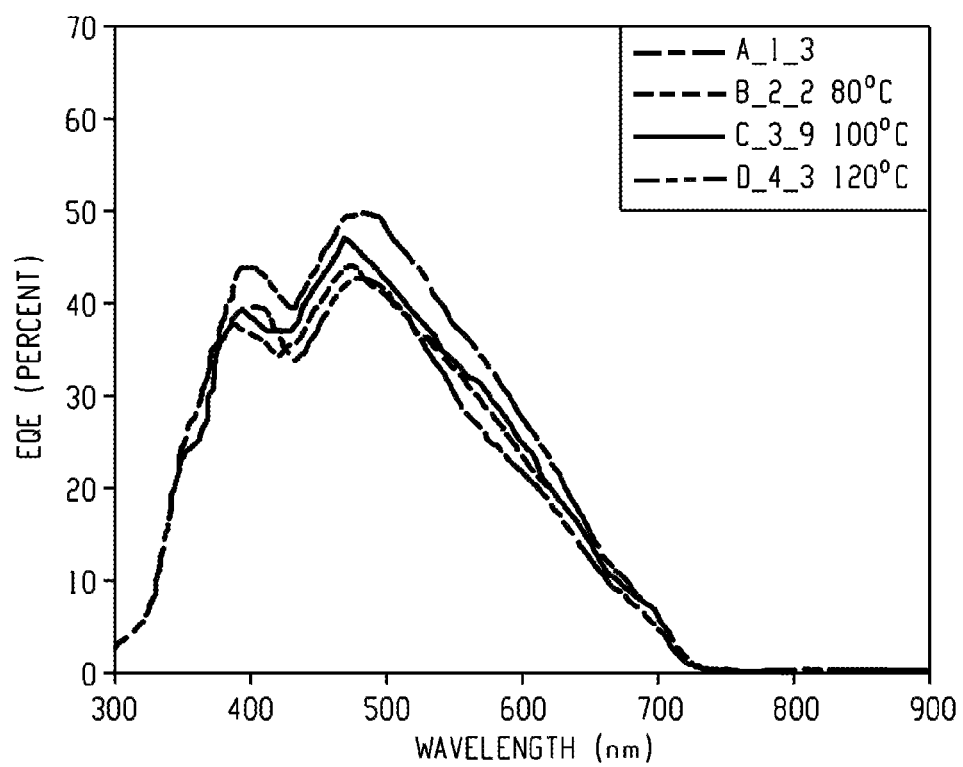

The effect of varying annealing temperature is shown in FIG. 5A and FIG. 5B. The parameters for devices A-D are as follows. Data is shown in Table 4.
Device A ITO/PEDOT:PSS/P1:PC71BM_CN(3%)/LiF (0.8 nm)/Al(100 nm)
Device B ITO/PEDOT:PSS/P1:PC71BM_CN(3%)_80° C./LiF(0.8 nm)/Al(100 nm)
Device C ITO/PEDOT:PSS/P1:PC71BM_CN(3%)_100° C./LiF(0.8 nm)/Al(100 nm)
Device D ITO/PEDOT:PSS/P1:PC71BM_CN(3%)_120° C./LiF(0.8 nm)/Al(100 nm)

TABLE 4

| Device | Conc. mg/mL | Spin Speed rpm | $J_{SC}$ mA/cm² | $V_{OC}$ V | FF (ave.) % | PCE (ave.) % | EQE (ave.) % |
|---|---|---|---|---|---|---|---|
| A | 6:24 | 800 | 4.84 | 0.88 | 34.1 (34.3) | 1.45 (1.35) | 42.5 (42.1) |
| B | 6:24 | 800 | 4.81 | 0.92 | 35.4 (35.1) | 1.57 (1.48) | 44.2 (43.3) |
| C | 6:24 | 800 | 5.15 | 0.94 | 35.1 (34.6) | 1.70 (1.46) | 46.8 (40.4) |
| D | 6:24 | 800 | 5.76 | 0.96 | 40.1 (38.1) | 2.22 (1.95) | 49.6 (47.6) |

What is claimed is:

1. A polymer comprising "n" repeating units of poly formula [I]:

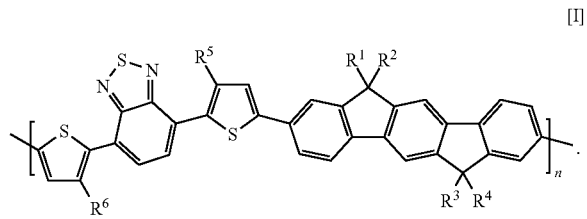

[I]

wherein "n" is an integer greater than 1;
wherein each of $R^1$ and $R^2$ is independently selected from C1-C18 alkyl, C1-C18 alkoxy, $Cy^1$, $Cy^1$-(C1-C18 alkyl)-, $Ar^1$, and $Ar^1$—(C1-C18 alkyl)-;
wherein $R^1$ and $R^2$ are optionally covalently bonded to form a 3- to 17-membered cycloalkyl or, together with 1-3 heteroatoms, comprise a 4- to 17-membered heterocycloalkyl;
wherein each of $R^3$ and $R^4$ is independently selected from C1-C18 alkyl, C1-C18 alkoxy, $Cy^1$, $Cy^1$-(C1-C18 alkyl)-, $Ar^1$, and $Ar^1$—(C1-C18 alkyl)-;
wherein $R^3$ and $R^4$ are optionally covalently bonded to form a 3- to 17-membered cycloalkyl or, together with 1-3 heteroatoms, comprise a 4- to 17-membered heterocycloalkyl;
wherein each of $R^5$ and $R^6$ is independently selected from C1-C18 alkoxy, C1-C18 monoalkylamino, C1-C18 dialkylamino, $Cy^1$, $Cy^1$-(C1-C18 alkyl)-, $Ar^1$, $Ar^1$—(C1-C18 alkyl)-, —(C1-C18 alkyl)-(C=O)$R^7$, —(C1-C18 alkyl)-(C=O)O$R^7$, —(C1-C18 alkyl)-S(O)—$R^7$, —(C=O)$R^7$, —(C=O)O$R^7$, and —S(O)$_m R^7$;
wherein $Ar^1$ is selected from phenyl and heteroaryl, and independently substituted with 0, 1, 2, 3, or 4 groups independently selected from C1-C18 alkyl, C1-C18 alkoxy, C1-C18 alkylamino, and C1-C18 dialkylamino;
wherein $Cy^1$ is selected from C3-C18 cycloalkyl and C2-C17 heterocycloalkyl, and substituted with 0, 1, 2, 3, or 4 groups independently selected from C1-C18 alkyl, C1-C18 alkoxy, C1-C18 alkylamino, and C1-C18 dialkylamino; and
wherein $R^7$ is selected from hydrogen, C1-C18 alkyl, C1-C18 alkoxy, C1-C18 monoalkylamino, and C1-C18 dialkylamino.

2. The polymer of claim 1, wherein the $R^1$, $R^2$, $R^3$, and $R^4$ are independently selected from C1-C18 alkyl, C1-C18 alkoxy, $Cy^1$, $Cy^1$-(C1-C18 alkyl)-, $Ar^1$, and $Ar^1$—(C1-C18 alkyl)-.

3. The polymer of claim 1, wherein the $R^1$, $R^2$, $R^3$, and $R^4$ are $C_8H_{17}$.

4. The polymer of claim 1, wherein each of $R^5$ and $R^6$ is —(C=O)$R^7$.

5. The polymer of claim 1, wherein the polymer has a number average molecular weight Mn in the range of from 16,000 to 500,000 Da.

6. The polymer of claim 1, wherein the polymer has a weight average molecular weight Mw in the range of from 25,000 to 800,000 Da.

7. The polymer of claim 1, wherein "n" is an integer ranging from 2 to 10,000.

8. The polymer of claim 1, wherein the polymer exhibits a polydispersity index in the range of 1.0 to 5.0.

9. The polymer of claim 1, wherein the polymer is a conductive polymer with electrical conductivity ranging from $10^{-10}$ to $10^7$ S/m.

10. The polymer of claim 1, wherein the polymer exhibits one or more optoelectronic properties.

11. The polymer of claim 1, wherein the polymer exhibits a small band gap ranging from 0.1 to 6 eV.

12. The polymer of claim 1, wherein the polymer is capable of absorbing light ranging from 100 nm to 3,000 nm.

13. The polymer of claim 1, wherein the polymer is a p-type polymer.

14. An article of manufacture comprising the polymer of claim 1.

15. The article of manufacture of claim 14, wherein the polymer is a conductor or semiconductor.

16. The article of manufacture of claim 14, wherein the article is a solar cell.

17. A polymer comprising "n" repeating units of poly formula [II]:

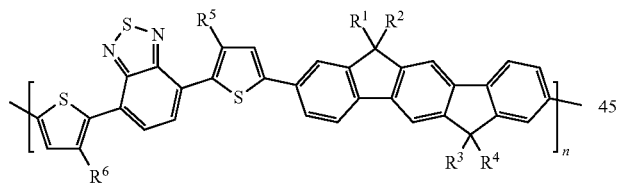

wherein "n" is an integer greater than 1;
wherein each of $R^1$ and $R^2$ is independently selected from C1-C18 alkyl, C1-C18 alkoxy, $Cy^1$, $Cy^1$-(C1-C18 alkyl)-, $Ar^1$, and $Ar^1$—(C1-C18 alkyl)-;
wherein $R^1$ and $R^2$ are optionally covalently bonded to form a 3- to 17-membered cycloalkyl or, together with 1-3 heteroatoms, comprise a 4- to 17-membered heterocycloalkyl;
wherein each of $R^3$ and $R^4$ is independently selected from C1-C18 alkyl, C1-C18 alkoxy, $Cy^1$, $Cy^1$-(C1-C18 alkyl)-, $Ar^1$, and $Ar^1$—(C1-C18 alkyl)-;
wherein $R^3$ and $R^4$ are optionally covalently bonded to form a 3- to 17-membered cycloalkyl or, together with 1-3 heteroatoms, comprise a 4- to 17-membered heterocycloalkyl;
wherein each of $R^5$ and $R^6$ is C1-C18 alkyl;
wherein $Ar^1$ is selected from phenyl and heteroaryl, and independently substituted with 0, 1, 2, 3, or 4 groups independently selected from C1-C18 alkyl, C1-C18 alkoxy, C1-C18 alkylamino, and C1-C18 dialkylamino;

wherein $Cy^1$ is selected from C3-C18 cycloalkyl and C2-C17 heterocycloalkyl, and substituted with 0, 1, 2, 3, or 4 groups independently selected from C1-C18 alkyl, C1-C18 alkoxy, C1-C18 alkylamino, and C1-C18 dialkylamino;

wherein $R^7$ is selected from hydrogen, C1-C18 alkyl, C1-C18 alkoxy, C1-C18 monoalkylamino, and C1-C18 dialkylamino, and wherein the polymer comprising "n" repeating units of poly formula [II] is obtained by reacting a monomer of formula [1] and a monomer of formula [2] in the presence of a transition metal catalyst:

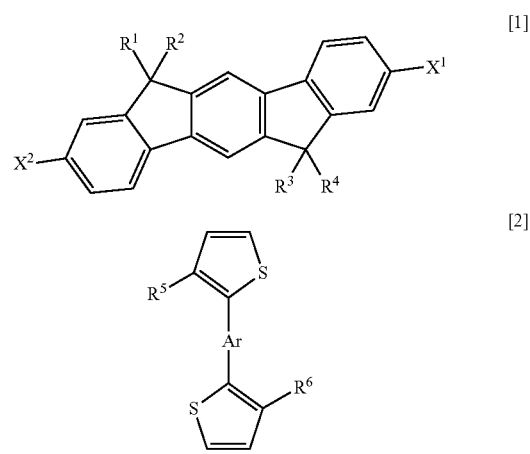

wherein
each of $X^1$ and $X^2$ is independently selected from a halogen, a triflate, a nonaflate, a fluorosulfonate, a tosylate, a mesylate, a nitrate, a phosphate, an oxonium ion, a diazonium salt, an ammonium salt, an alcohol, and an ether, and
groups $R^1$-$R^6$ have the same definition as in poly formula [II].

18. The polymer of claim 17, wherein the $R^5$ and $R^6$ are $C_6H_{13}$.

19. The polymer of claim 17, wherein the polymer comprises "n" repeating units of the formula [II]:

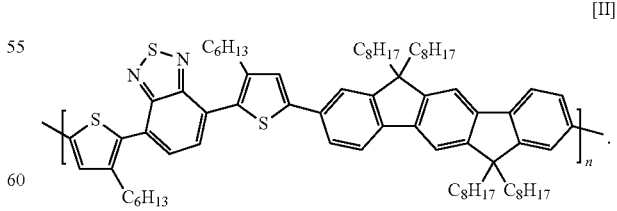

20. An article of manufacture comprising the polymer of claim 17.

21. The article of manufacture of claim 20, wherein the polymer comprises "n" repeating units of the formula [II]:

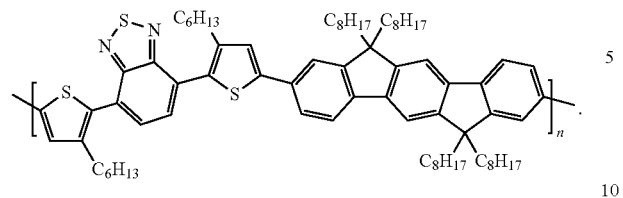
22. The article of manufacture of claim 21, wherein the polymer is a conductor or semiconductor.
23. The article of manufacture of claim 20, wherein the article is a solar cell.
24. The polymer of claim 17, wherein the polymer has a number average molecular weight Mn in the range of from 16,000 to 500,000 Da and exhibits polydispersity index in the range of from 2.0 to 2.5.
* * * * *